(12) United States Patent
Wang

(10) Patent No.: US 6,743,674 B2
(45) Date of Patent: Jun. 1, 2004

(54) METHOD OF FORMING A SEMICONDUCTOR ARRAY OF FLOATING GATE MEMORY CELLS AND STRAP REGIONS, AND A MEMORY ARRAY AND STRAP REGIONS MADE THEREBY

(75) Inventor: Chih Hsin Wang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/205,289

(22) Filed: Jul. 24, 2002

(65) Prior Publication Data

US 2003/0053347 A1 Mar. 20, 2003

Related U.S. Application Data

(60) Provisional application No. 60/323,445, filed on Sep. 18, 2001.

(51) Int. Cl.$^7$ .............................................. H01L 21/336
(52) U.S. Cl. ...................................... 438/257; 438/258
(58) Field of Search ................................ 438/257, 258

(56) References Cited

U.S. PATENT DOCUMENTS

| | | | |
|---|---|---|---|
| 4,757,360 A | 7/1988 | Farone | |
| 4,794,565 A | 12/1988 | Wu et al. | |
| 4,882,707 A | 11/1989 | Mizutani | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,101,250 A | 3/1992 | Arima et al. | |
| 5,268,319 A | 12/1993 | Harari | |
| 5,429,965 A | 7/1995 | Shimoji | |
| 5,544,103 A | 8/1996 | Lambertson | |
| 5,572,054 A | 11/1996 | Wang et al. | |
| 5,656,527 A | * 8/1997 | Choi et al. | 438/258 |
| 5,712,178 A | * 1/1998 | Cho | 438/201 |
| 5,716,864 A | * 2/1998 | Hirofumi | 438/258 |
| 5,780,341 A | 7/1998 | Ogura | |
| 5,780,892 A | 7/1998 | Chen | |
| 5,789,293 A | 8/1998 | Cho et al. | |
| 5,796,139 A | 8/1998 | Fukase | |
| 5,808,328 A | 9/1998 | Nishizawa | |
| 5,811,853 A | 9/1998 | Wang | |
| 5,814,853 A | 9/1998 | Chen | |
| 6,034,416 A | * 3/2000 | Takashi et al. | 257/623 |
| 6,091,104 A | 7/2000 | Chen | |
| 6,103,573 A | 8/2000 | Harari et al. | |
| 6,140,182 A | 10/2000 | Chen | |
| 6,222,227 B1 | 4/2001 | Chen | |

FOREIGN PATENT DOCUMENTS

EP    0 389 721 A2    10/1990

OTHER PUBLICATIONS

U.S. patent application Ser. No. 09/401,622, Johnson, filed Sep. 22, 1999.

* cited by examiner

*Primary Examiner*—David Nelms
*Assistant Examiner*—Thao P. Le
(74) *Attorney, Agent, or Firm*—Gray Cary Ware & Freidenrich LLP

(57) ABSTRACT

A self aligned method of forming a semiconductor memory array of floating gate memory cells in a semiconductor substrate, along with strap regions interlaced within the array. The array includes word lines and source lines that connect together control gates and source regions from memory cells contained in row within the array. The strap regions include word line strap cells through which the word lines traverse, wherein the word lines completely traverse across the strap regions, and source line strap cells in which the source lines terminate without completely traversing across the strap region. The control gate polysilicon is formed over the substrate, and protected by a layer of protective material, before the formation of other polysilicon elements associated with the memory array, to ensure the proper remove of residual polysilicon stringers.

10 Claims, 30 Drawing Sheets

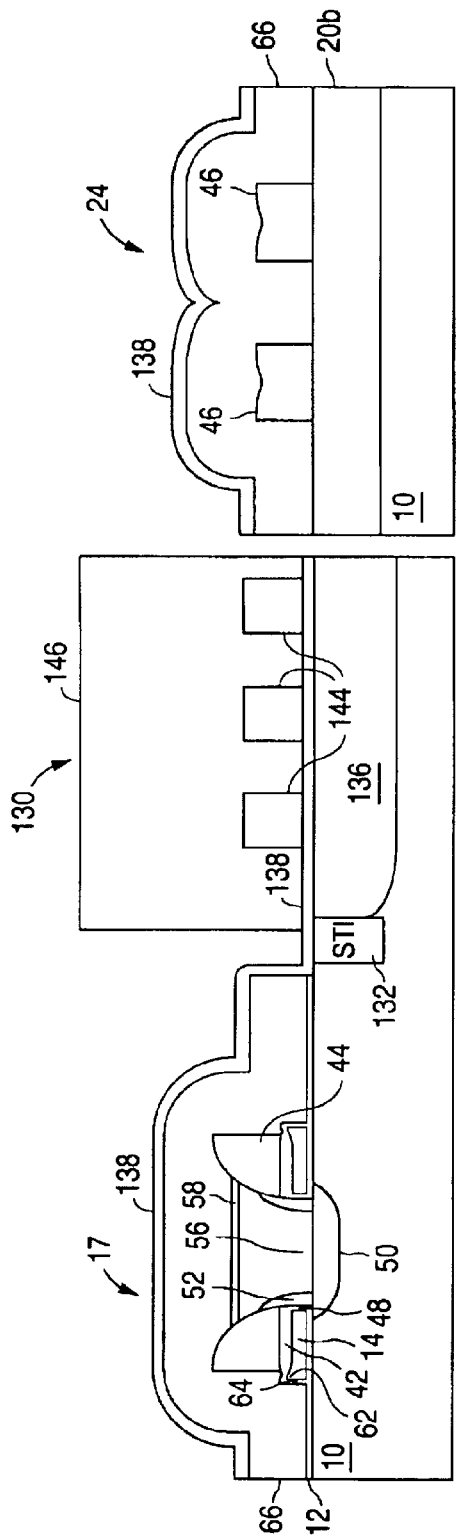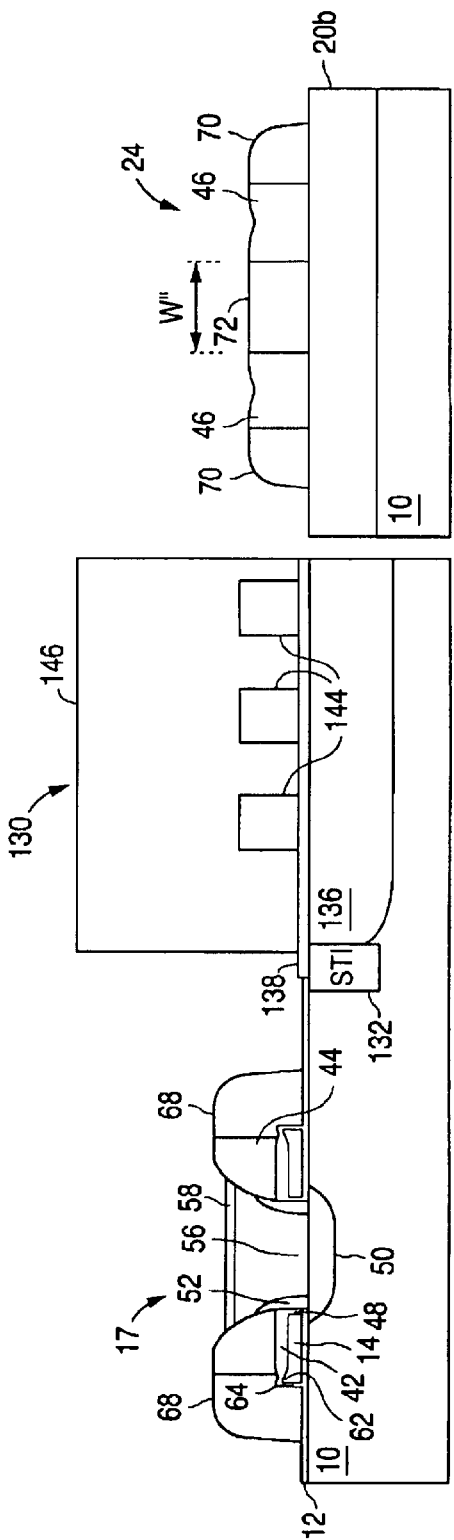

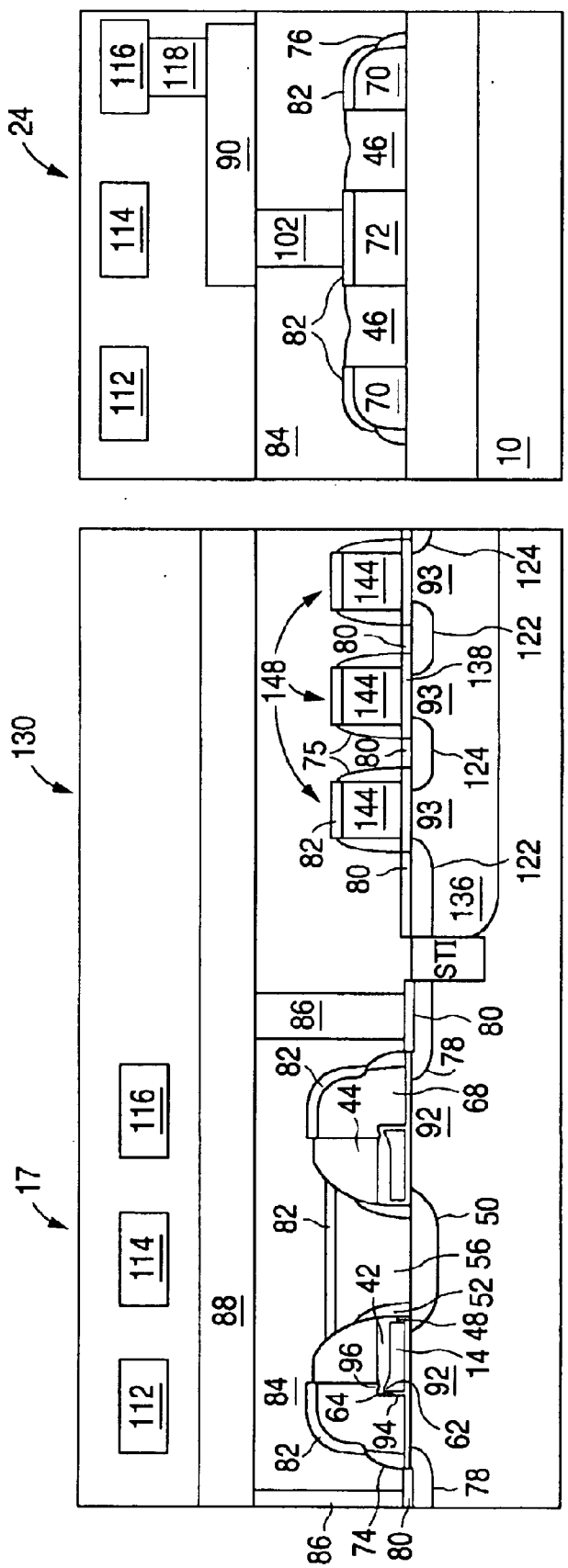

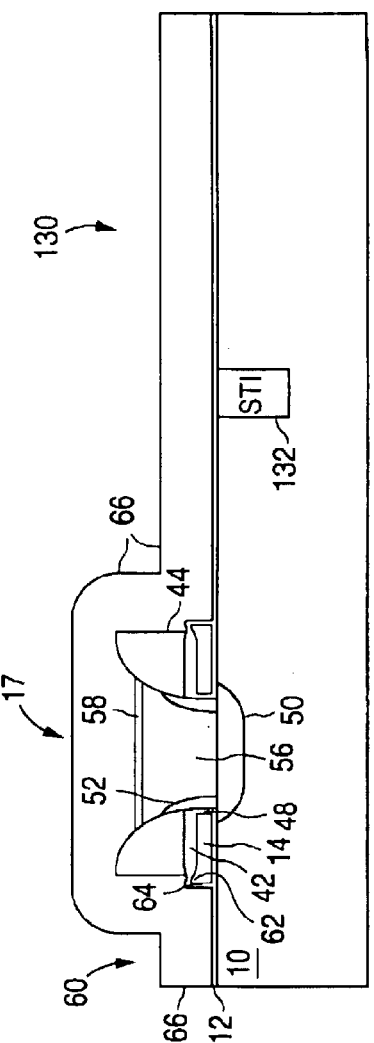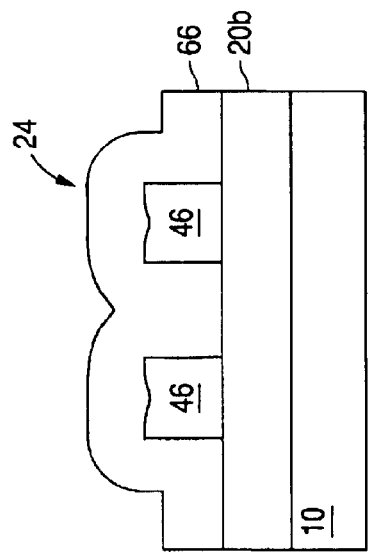
FIG. 14A    FIG. 15A
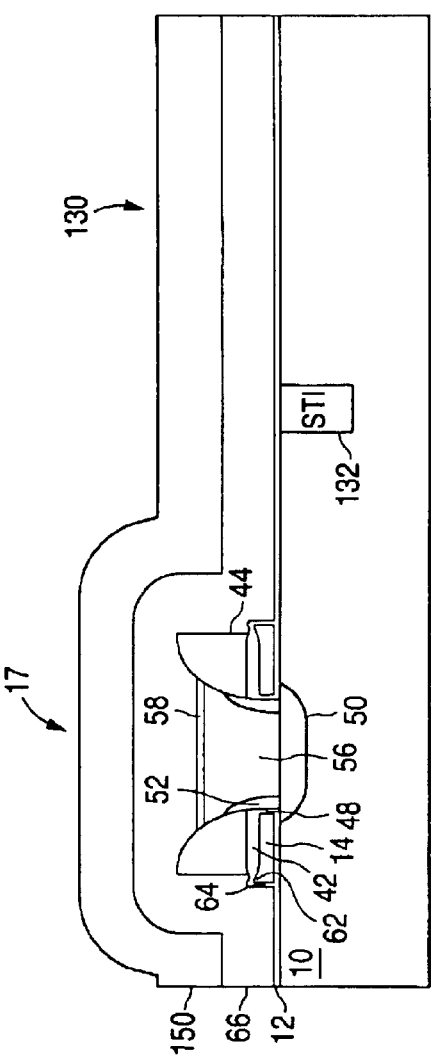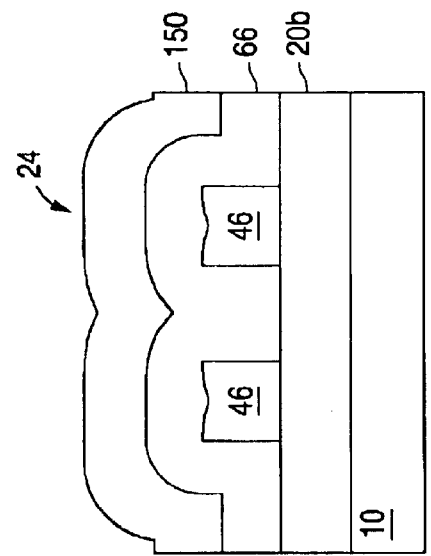
FIG. 14B    FIG. 15B

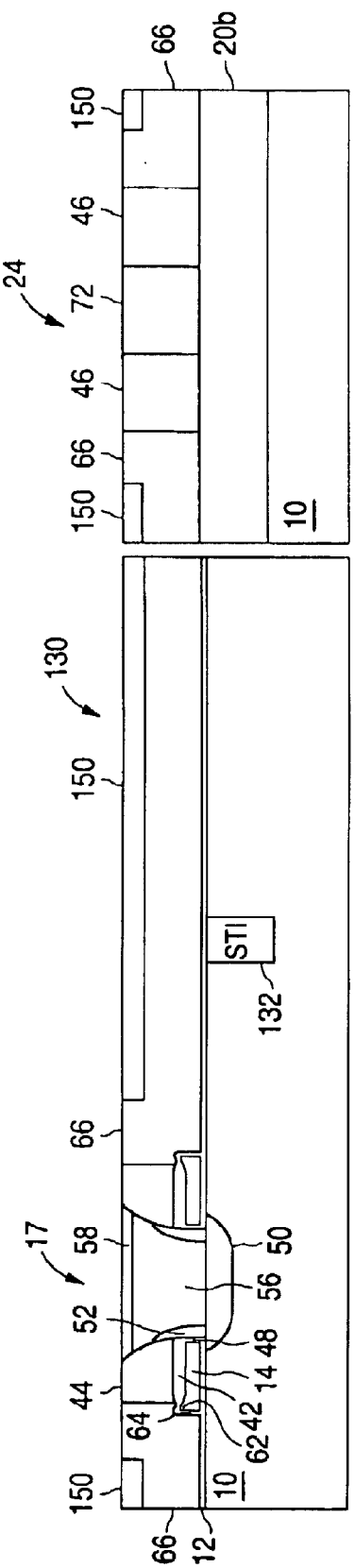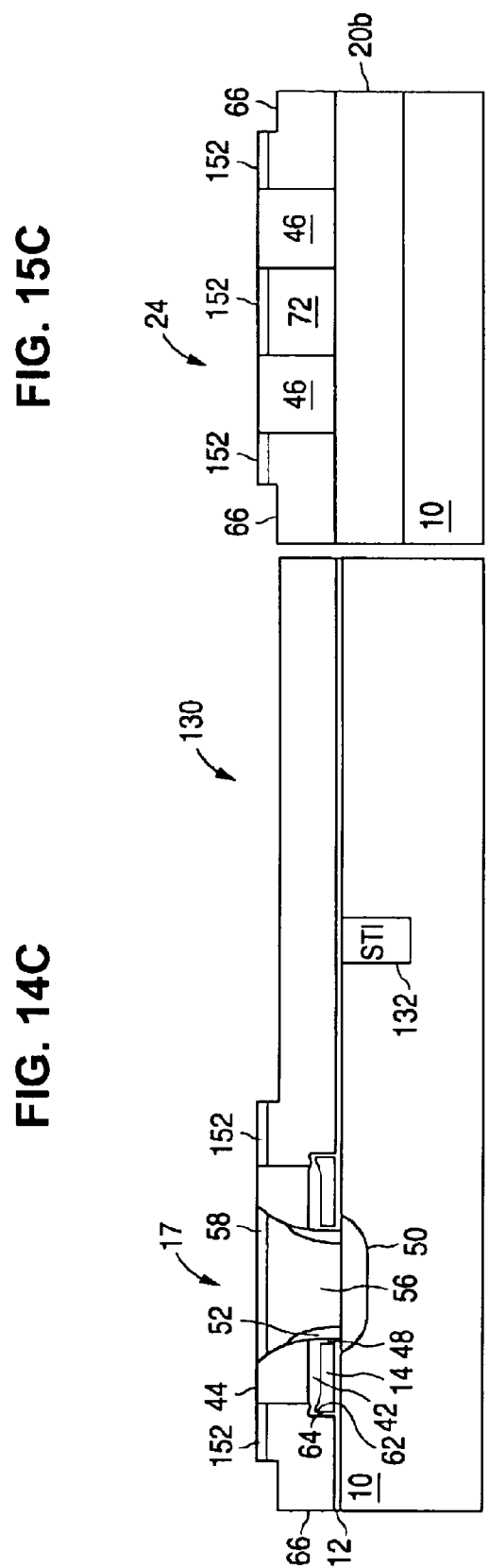

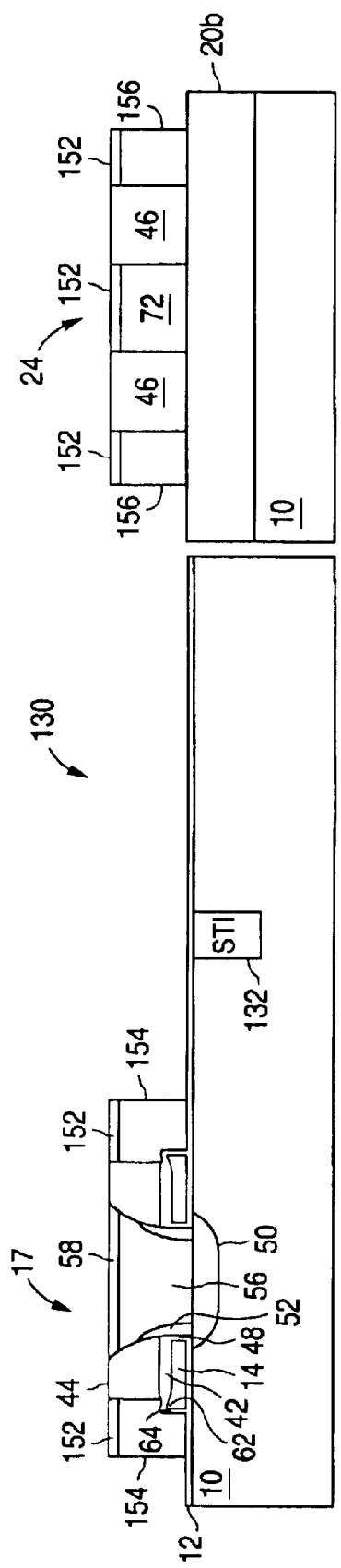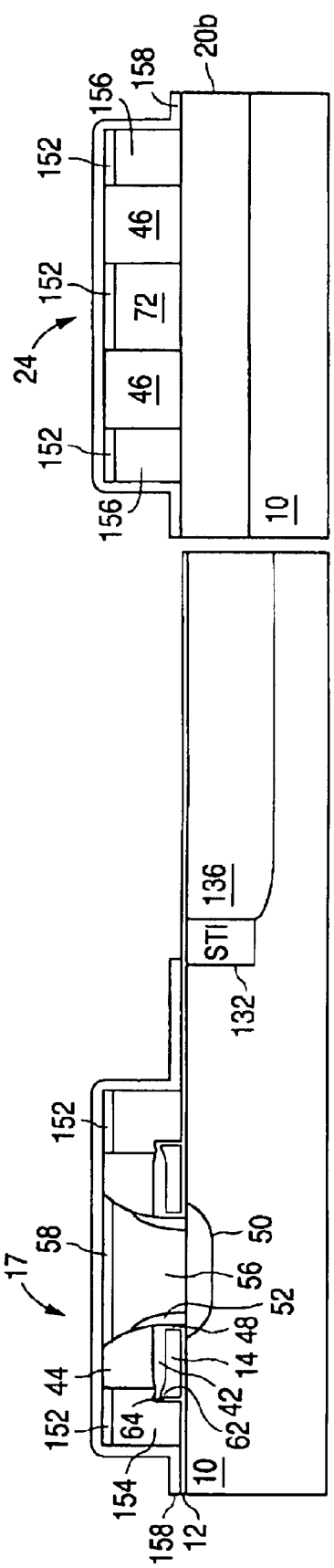

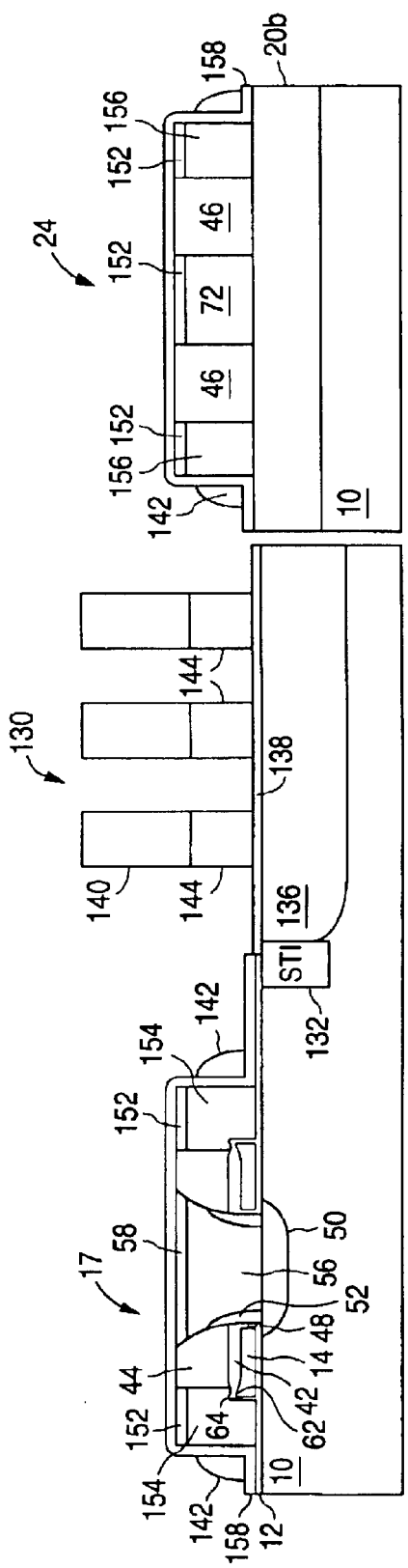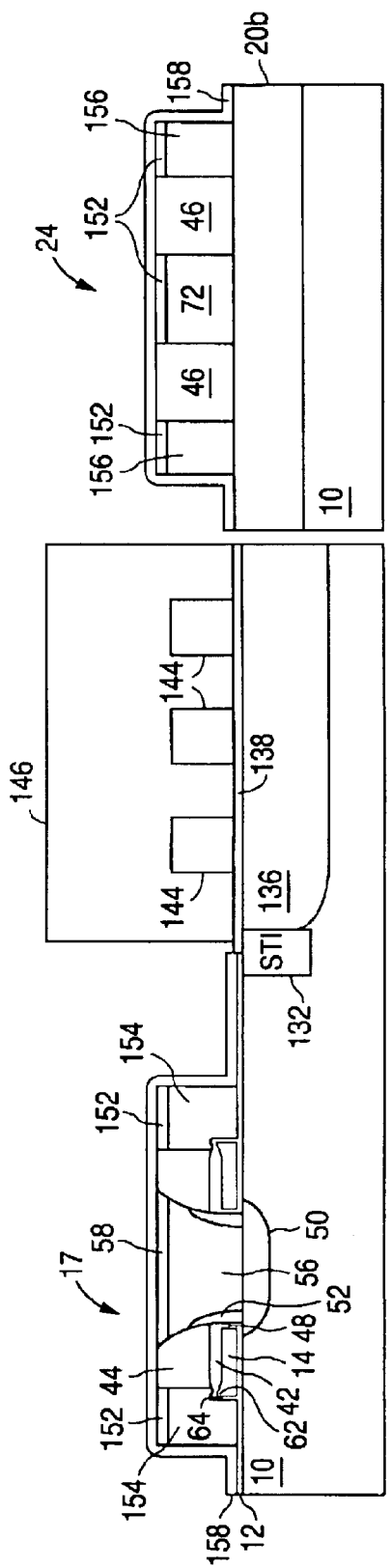

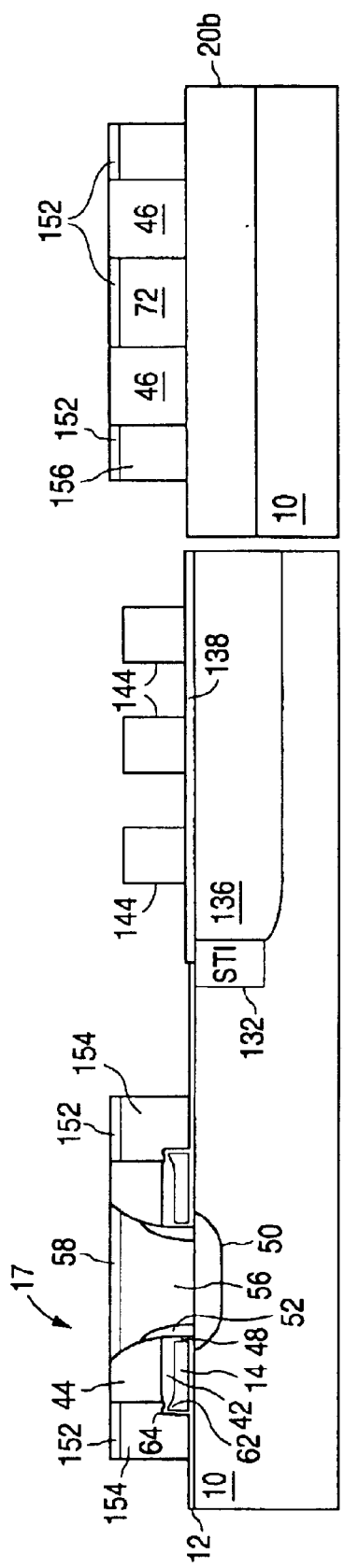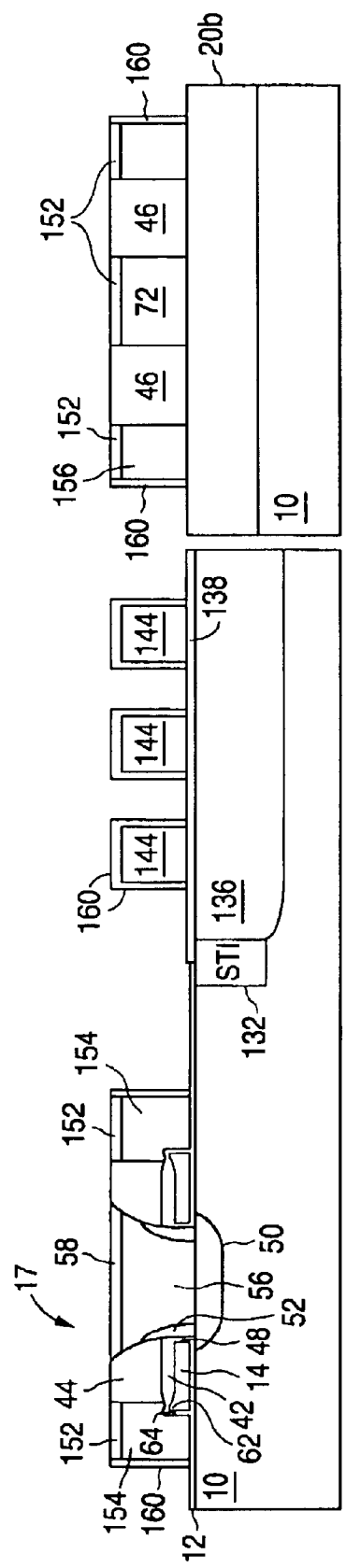

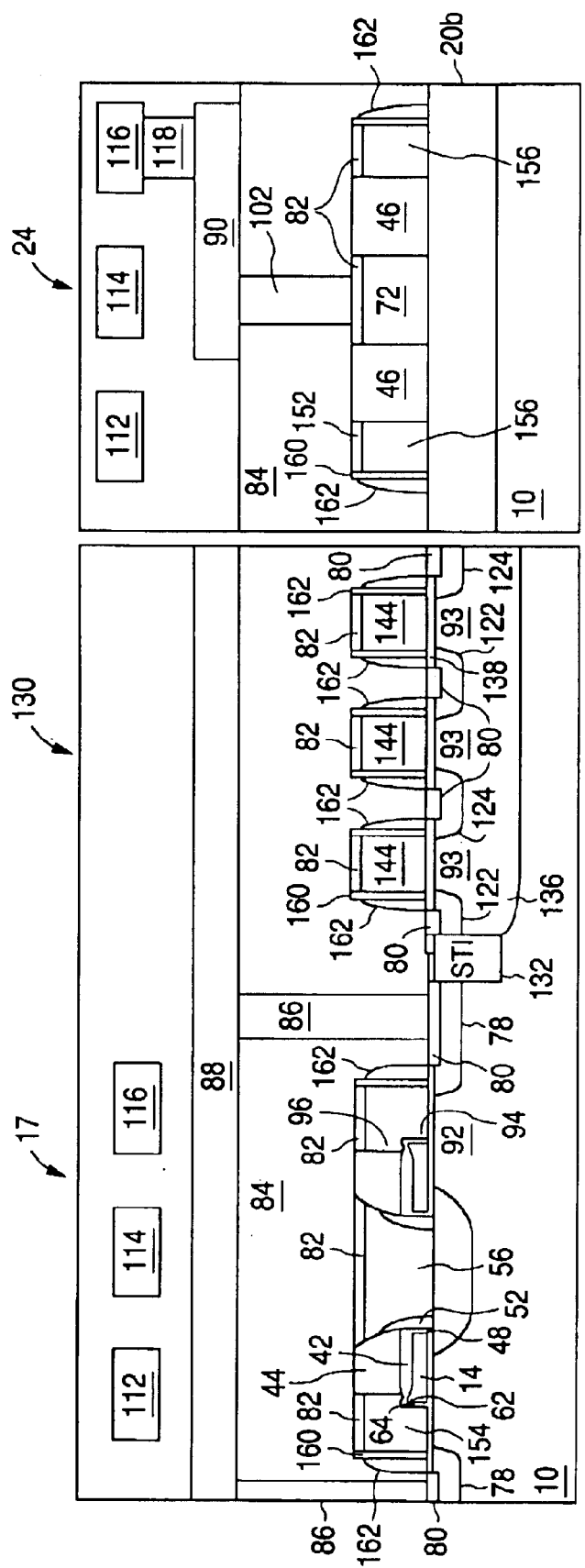

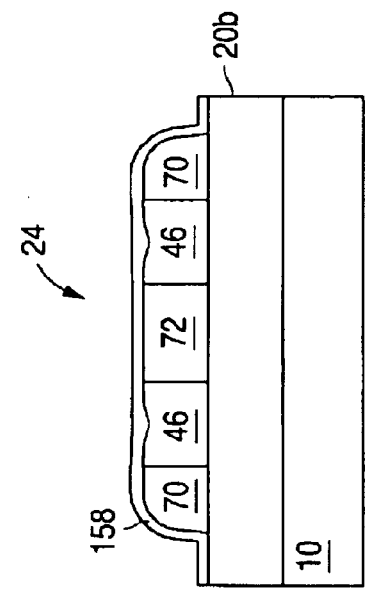
FIG. 17C
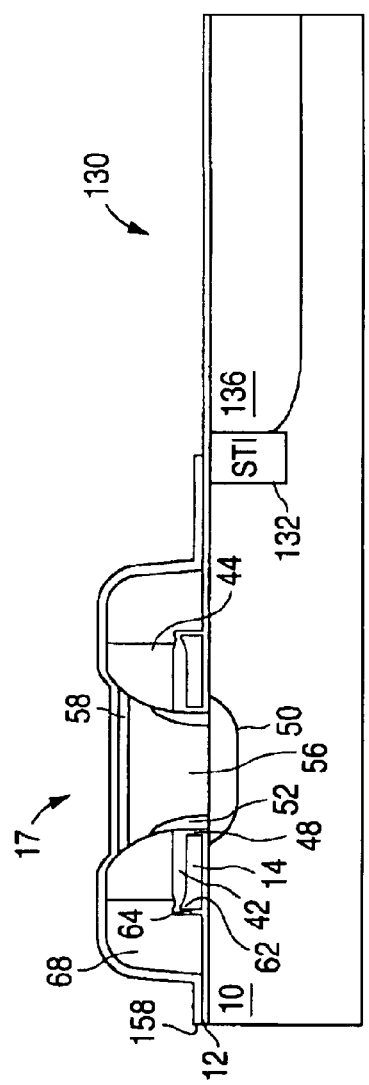
FIG. 17D
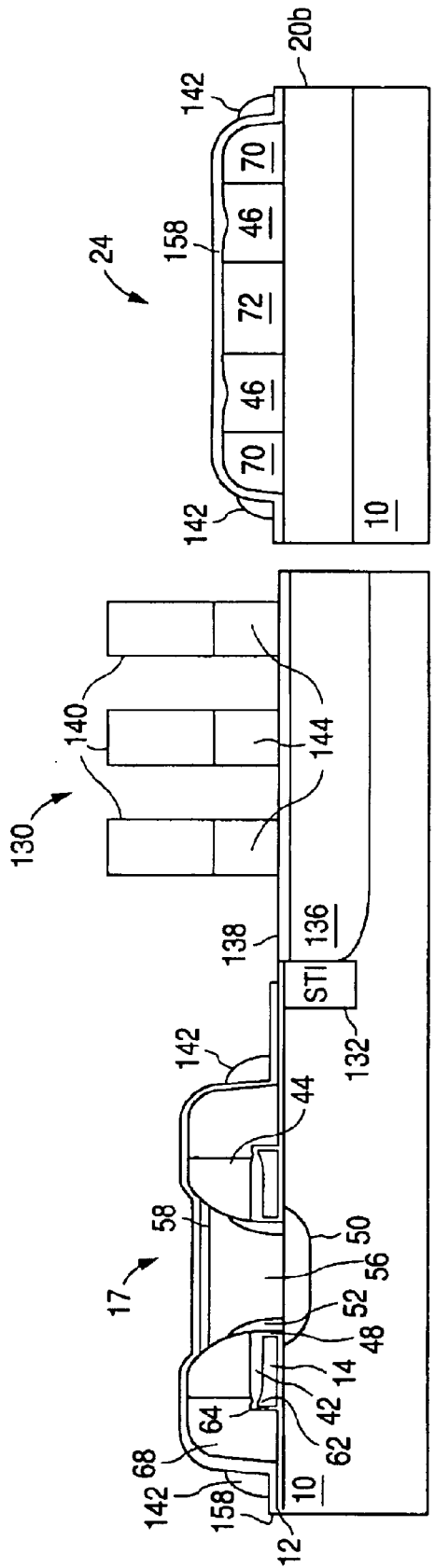
FIG. 18C
FIG. 18D

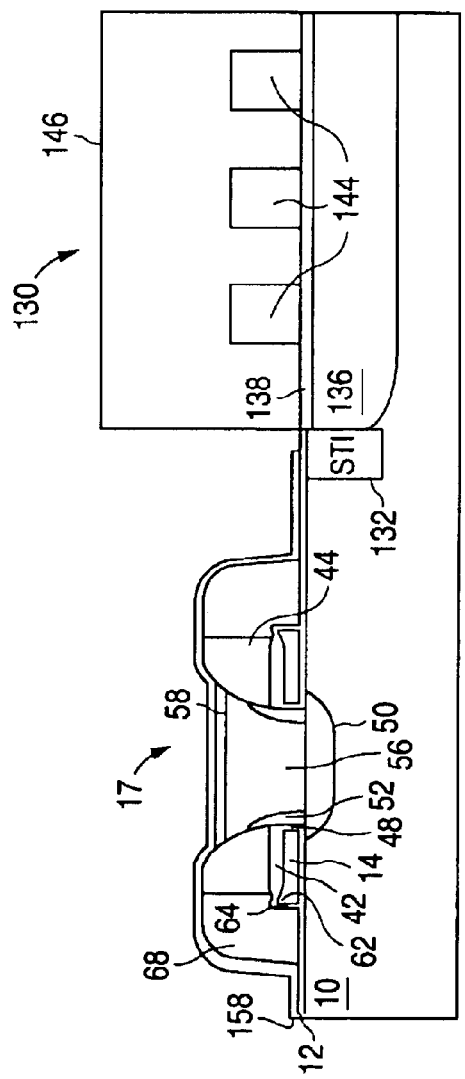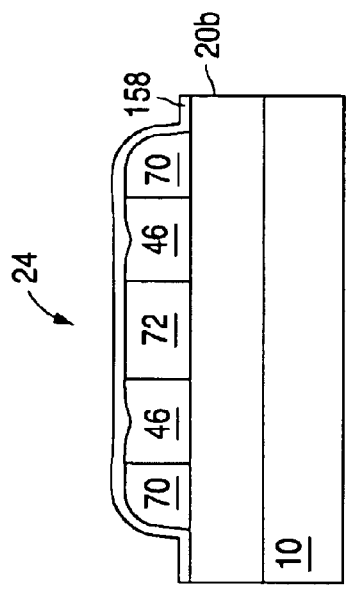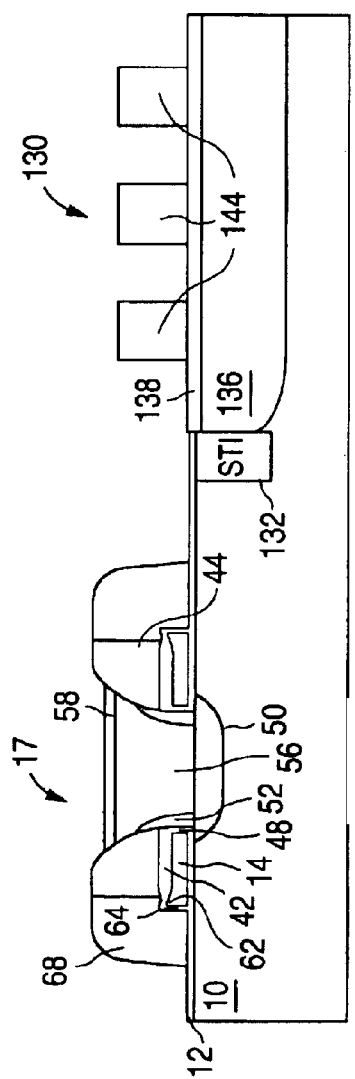

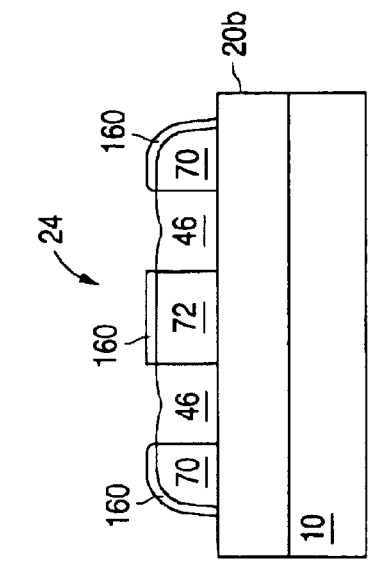
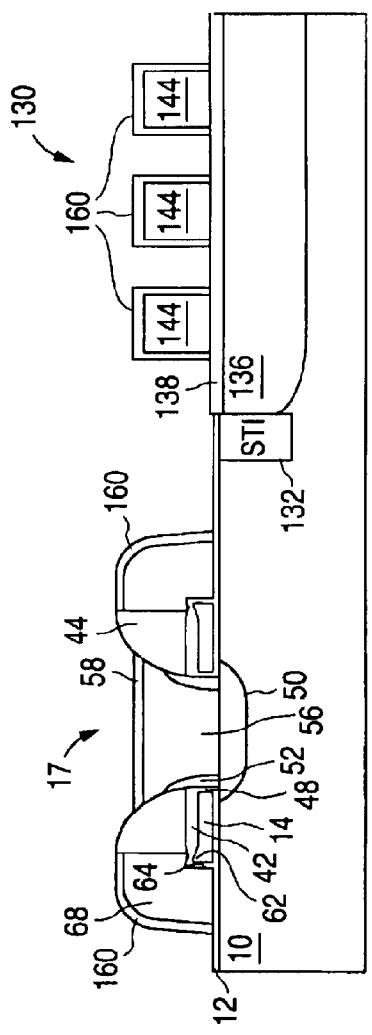
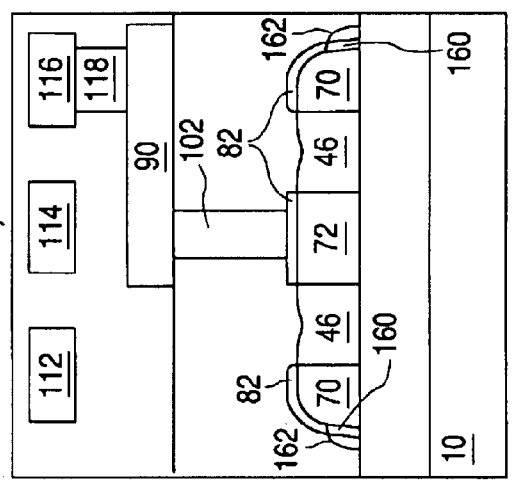
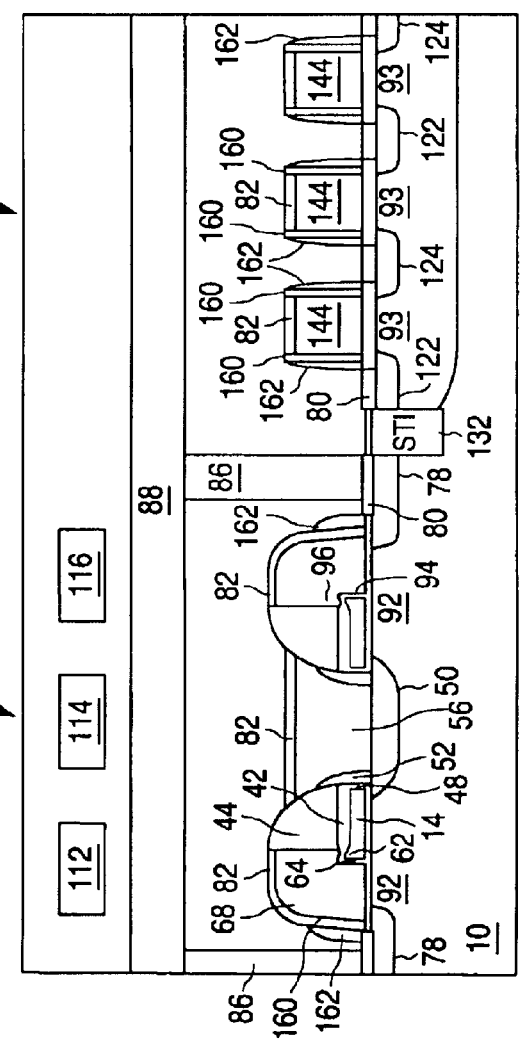

METHOD OF FORMING A SEMICONDUCTOR ARRAY OF FLOATING GATE MEMORY CELLS AND STRAP REGIONS, AND A MEMORY ARRAY AND STRAP REGIONS MADE THEREBY

This application claims the benefit of U.S. Provisional Application No. 60/323,445, filed Sep. 18, 2001, and entitled *A Method Integrating A Self-Aligned Flash E2 Prom Cell Into A CMOS Baseline Process.*

TECHNICAL FIELD

The present invention relates to a method of forming strap regions to make electrical contacts with memory cells in an array of semiconductor non-volatile memory cells, and more particularly, in the preferred embodiment, to an array of floating gate memory cells of the split gate type. The present invention also relates to a method of forming a logic or peripheral region on the same semiconductor substrate adjacent the memory cell array, where the structure has a simplified topography, box shaped word poly's, and logic polysilicon elements formed separately from those of the memory cells.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, self alignment minimizes the number of masking steps necessary to form memory cell structures, and enhances the ability to scale such structures down to smaller dimensions.

In the manufacture of memory cell arrays, it is also known to form cell elements that extend across the entire array of memory cells. For example, with an array having interlaced columns of isolation and active regions, with a plurality of memory cells in each active region, memory cell elements such as control gates, source regions, drain regions etc. can be formed to continuously extend across an entire row or column of memory cells. In order to ensure an equalized voltage on such elements for all the memory cells in the target row/column, strap regions have been used to provide multiple electrical connections along the length of continuously formed memory cell elements, so that uniform voltages are applied to all the memory cells in the affected row/column.

FIG. 1 illustrates a known strap region design. Strap region 1 is formed along side a memory cell array 2. The memory cell array 2 includes columns of active regions 3 interlaced with columns of isolation regions 4. Rows of memory cell pairs 5 are formed with word lines 6 and source lines 7 extending along the memory cell rows, with each pair of memory cells having two word lines 6 and sharing a single source line 7. (Those of skill in the art will recognize that the term source and drain may be interchanged. Further, the word line is connected to the control gate of the floating gate memory cell. Thus, the term control gate or control gate line may also be used interchangeably with the term word line). Typically, the word line and the source lines are made of polysilicon or polysilicide or salicide material. Thus, pure metal lines are used to strap these lines. Strap cells 8 are formed on the control gates 6 and source lines 7 as they traverse the strap region 1. Electrical contacts 9a and 9b are then formed onto the control gate (word) lines 6 and source lines 7 respectively by metal lines (not shown) traversing in the word line direction positioned above the array shown in FIG. 1 and electrically insulated therefrom for supplying the desired voltages to the various rows of control gates 6 and source lines 7.

Ideally, for larger memory arrays, a plurality of strap regions are interlaced within the memory cell array (e.g. one strap region for every 128 cells in the word line direction). Preferably, the strap regions are formed simultaneously with the process steps used to make the memory cell array.

As device geometries get smaller, it is increasingly difficult to reliably form electrical connections to the strap regions 8. The word lines 6 are very close to the source lines 7, and get even closer with smaller device geometries. As the distance between the control gate lines 6 and source line 7 shrinks, it becomes more difficult to form contacts 9a and 9b properly. For example, just a small shift of one of the control gate line 6 contacts toward an adjacent source line 7 would result in the contact being formed over both a word line 6 and a source line 7, thus shorting the two together. Further, there is simply no room to enlarge and separate the strap cells to increase the tolerance of the contact formation steps.

One or more logic or peripheral regions are formed adjacent to the memory cell array on the same silicon substrate. Logic devices (i.e. MOS FET's, etc.) are formed in these regions to operate the memory cell array or perform logic functions related to the memory cell array. In order to form such logic devices along side the memory cell array, the topography of the resulting structure can be complex, resulting in the formation of unwanted layers and spacers that are difficult to remove once the structure formation is complete. Further, certain elements of the logic devices and memory cells are often formed with the same processing steps, thus coupling the formation of these elements together. This can make it difficult to optimize elements of the logic devices without adversely affecting elements of the memory cells, and vice versa.

Thus, there is a need for a strap cell design, and a manufacturing method thereof, that minimizes the risk of shorting source lines 7 and word lines 6 together during the formation of the strap cells, and/or during the formation of electrical contacts connected thereto. There is also a need to form such strap cells using the same processing steps that are used to form the memory cells in the active regions. Further, there is a need to form a logic/peripheral region adjacent the memory cell array where the structure has a simplified topography, box shaped word line poly's, and logic poly's formed separately from those in the memory cells.

SUMMARY OF THE INVENTION

The present invention provides a memory cell array with a strap region that minimizes the risk of shorting the source and word lines together, maximizes the spacing of contacts in the strap region to enable further scaling of device geometries, and provides for logic devices formed in a decoupled manner and in a manner such that the structure has a simplified topography.

The method of the present invention includes the steps of forming a plurality of memory cells in a memory portion of a semiconductor substrate, forming a layer of protective material over control gates of the memory cells, forming a plurality of logic devices that includes forming residual conductive material on the layer of protective material, and removing the residual conductive material. The formation of each of the memory cells includes the steps of forming a floating gate of conductive material disposed over and insulated from the memory portion of the substrate, and forming a control gate of conductive material disposed over and insulated from the memory portion of the substrate. The layer of protective material is formed over the control gates. The plurality of logic devices are formed in a peripheral region of the semiconductor substrate after the formation of the protective material layer. The formation of each of the logic devices includes the step of forming a block of conductive material disposed over and insulated from the peripheral region of the substrate. The formation of the blocks of conductive material includes the formation of the residual conductive material on the layer of protective material. The residual conductive material is removed without removing the conductive material of the control gates.

Other objects and features of the present invention will become apparent by a review of the specification, claims and appended figures.

BRIEF DESCRIPTION OF THE DRAWINGS

FIGS. 14A–14K are cross sectional views taken along the line 2—2 of FIG. 2C showing in sequence the step(s) in the first alternate embodiment of the processing of the structure shown in FIG. 3L, in the formation of a non volatile memory array of floating memory cells of the split gate type.

FIGS. 15A–15K are cross sectional views of the strap regions showing in sequence the step(s) in the first alternate embodiment of the processing of the strap region structure of FIG. 4L.

FIGS. 17A–17H are cross sectional views taken along the line 2—2 of FIG. 2C showing in sequence the step(s) in the second alternate embodiment of the processing of the structure shown in FIG. 3L, in the formation of a non volatile memory array of floating memory cells of the split gate type.

FIGS. 18A–18H are cross sectional views of the strap regions showing in sequence the step(s) in the second alternate embodiment of the processing of the strap region structure of FIG. 4L.

DETAILED DESCRIPTION OF THE PREFERRED EMBODIMENTS

The present invention is an array of non-volatile memory cells having a strap cell design, and method of making such strap cells, with enhanced contact formation. The strap cells are formed using the same processing steps that are used to form the array of memory cells. The strap cell regions containing the strap cells are interlaced among an array of non-volatile memory cells having word lines and source lines that extend across rows of memory cells. Co-pending patent application Ser. No. 09/917,023, filed on Jul. 26, 2001, which is commonly assigned to the assignee of the present invention, and whose disclosure is hereby incorporated by reference herein, discloses a self aligned method of forming a split gate non-volatile memory cell array. In the preferred embodiment, the strap cell regions of the present invention will be disclosed in the context of forming such a split gate non-volatile memory cell array, although it should be apparent that the present invention can also be practiced with other types of array of memory cells, in which the array is traversed by a row of source (or drain) line and parallel thereto a row of word line. The present invention also includes a logic devices formed in a logic/peripheral region adjacent to the memory cell array having a simplified topography and formed in a decoupled manner so that the poly elements of the logic devices and the memory cells can be separately optimized.

Isolation Region Formation

Figure 2A:
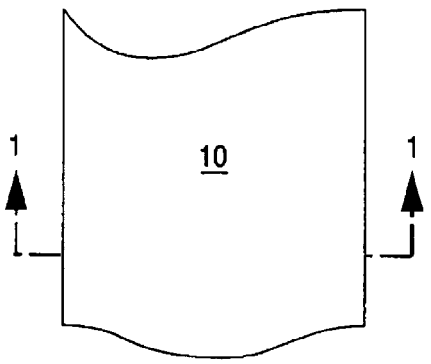
FIG. 2A is a top view of a semiconductor substrate used in the first step of the method of present invention to form isolation regions.
Figure 2B:
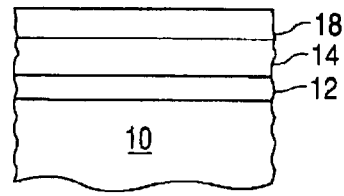
FIG. 2B is a cross sectional view of the structure taken along the line 1—1 showing the initial processing steps of the present invention.

Referring to FIG. 2A there is shown a top plan view of a semiconductor substrate 10 (or a semiconductor well), which is preferably of P type and is well known in the art. A first layer of insulation material 12, such as silicon dioxide (oxide), is deposited thereon as shown in FIG. 2B. The first insulation layer 12 is formed on the substrate 10 by well known techniques such as oxidation or deposition (e.g. chemical vapor deposition or CVD), forming a layer of oxide preferably 80 Å thick. A first layer of polysilicon 14 (hereinafter "poly") is deposited on top of the first layer of insulation material 12 (e.g. 700 to 800 Å thick). The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD (e.g. 1000 Å thick). This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 2C:
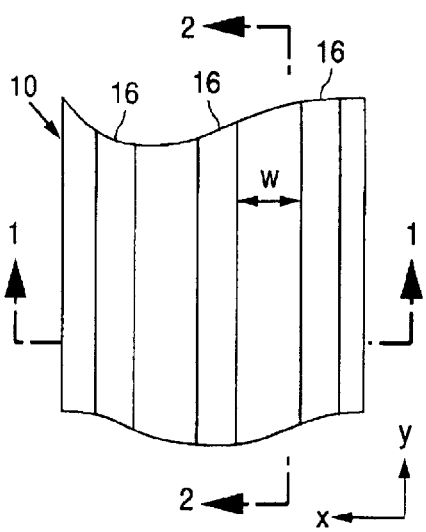
FIG. 2C is a top view of the structure showing the next step in the processing of the structure of FIG. 2B, in which isolation regions are formed.
Figure 2D:
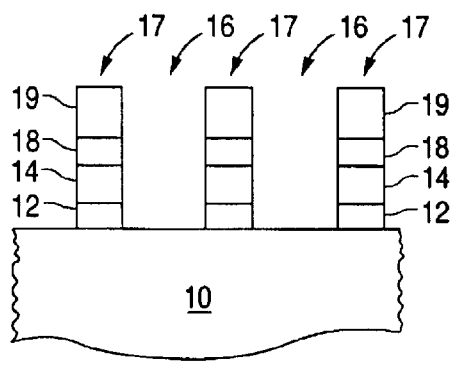
FIG. 2D is a cross sectional view of the structure in FIG. 2C taken along the line 1—1 showing the trenches to be formed as isolation stripes in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y or column direction, as shown in FIG. 2C, using standard etching techniques (i.e. anisotropic etch processes). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 2D, with active regions 17 interlaced with isolation regions 16. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 2E:
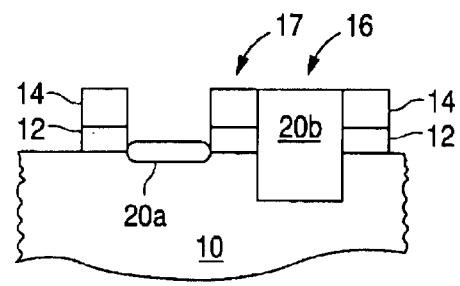
FIG. 2E is a cross sectional view of the structure in FIG. 2C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 2E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 2E represents a self aligned structure, which is more compact than a structure formed by a non self-aligned method. A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

In the above processing steps, one or more isolation regions are designated as strap regions 24 (see description of FIG. 4A below), in which strap cells for the word lines and source lines will be formed. Again, as used herein, the term source line is meant to include drain line as well. The width of the strap regions 24 is preferably wider than the width of the isolation regions 16 to accommodate the formation of the strap cells therein. Thus, the resulting structure includes sets of interlaced columns of active and isolation regions, with columns of strap regions 24 interlaced between the sets of active/isolation regions. In the preferred embodiment, a strap region column is formed between every set of 128 or 256 active and isolation regions 17/16.

Memory Array Formation

Figure 3A:
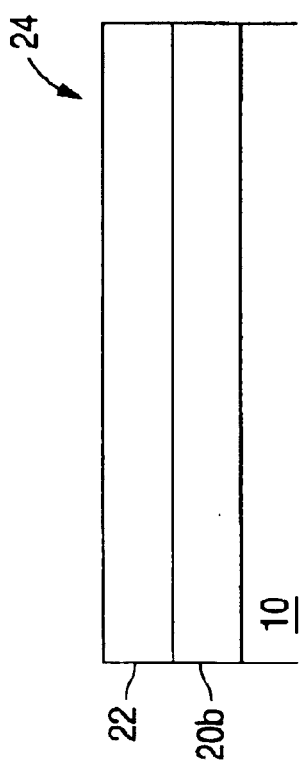
FIGS. 3A–3S are cross sectional views taken along the line 2—2 of FIG. 2C showing in sequence the next step(s) in the processing of the structure shown in FIG. 2C, in the formation of a non volatile memory array of floating memory cells of the split gate type.

With the structure shown in FIG. 2E made using either the self aligned method or the non self-aligned method, the structure is further processed as follows. FIGS. 3A to 3S show the cross section of the active region structure 17 from a view orthogonal to that of FIGS. 2B and 2E, and FIGS. 4A to 4S show the cross section of the strap region structure 24 from the same orthogonal view, as the next steps in the process of the present invention are performed concurrently on both regions. It should be appreciated that while only a single active region 17 and single 24 strap region are shown, the processing steps illustrated below form an array of such regions.

Figure 4A:
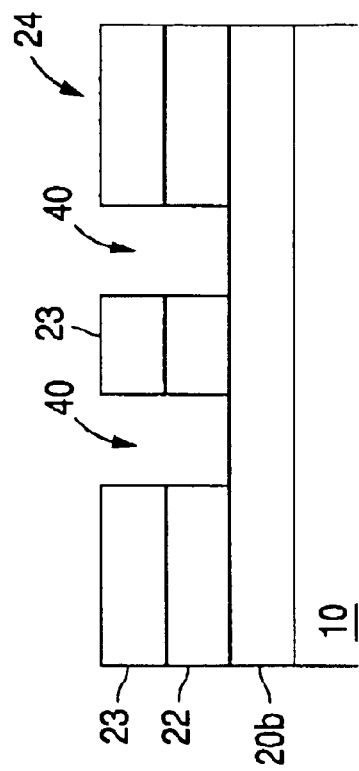
FIGS. 4A–4S are cross sectional views of the strap regions showing in sequence the next step(s) in the processing of the strap region structure imaged by the line 4B—4B portion of the mask of FIG. 5.

An insulation layer 22 is first formed on the structure. Specifically, a nitride layer 22 is deposited across the entire surface of the structure (e.g. 3000 Å thick). The resulting active region structure is shown in FIG. 3A, and the resulting strap region structure is shown in FIG. 4A.

Figure 5:
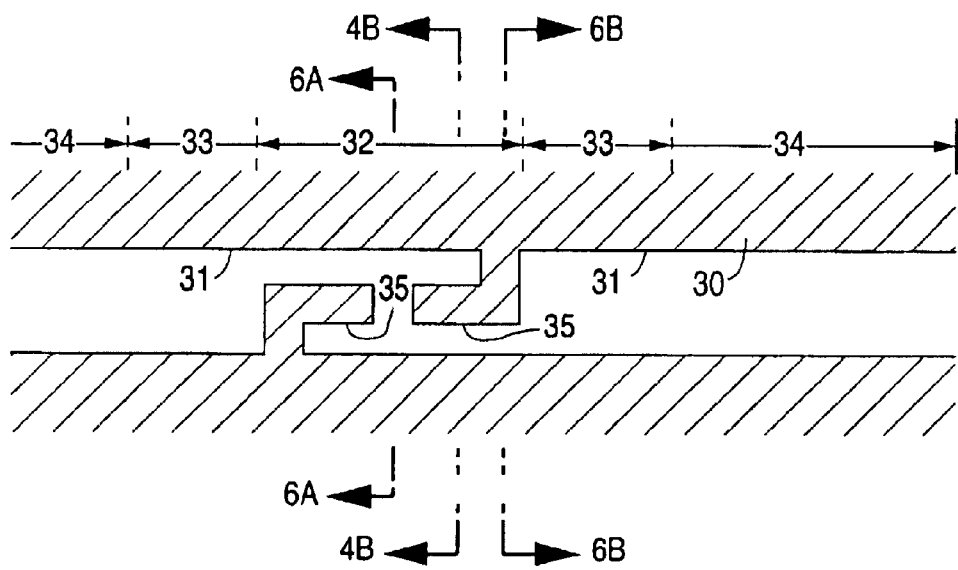
FIG. 5 is a top view of a portion of the mask used to form the first trenches in the active regions and the 'H' shaped strap cells in the strap regions.

A masking operation is performed on both the active/isolation regions 17/16 and the strap region 24, by first applying photo-resist 23 on top of the nitride layer 22. A masking step is applied to the structure using a mask 30, as illustrated in FIG. 5. Mask 30 is formed of an opaque masking material (such as metal) that contains a patterned aperture 31 for defining masking regions on the structure from which material is to be removed. Mask 30 includes a first mask region 32 (for defining the word line (WL) strap cells), a second mask region 33 (for defining the source line (SL) strap cells), and a third mask region 34 (for forming the memory cell array). The mask 30 shown in FIG. 5 is used to define a single strap region row and single row of memory cells. Thus, a mask having an array of geometries 30 is used to define the memory cell array including the strap regions of the present invention.

Figure 3B:
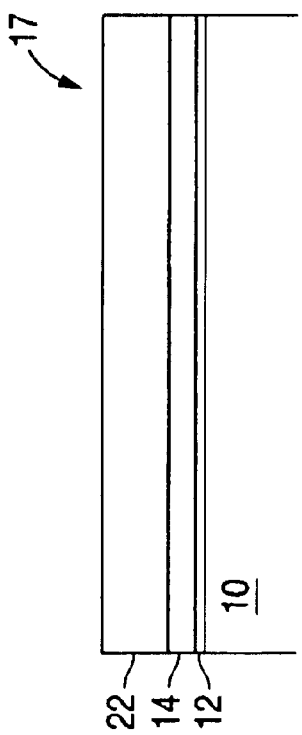

The mask regions 34 include single linear apertures for defining parallel stripe masking regions over the active and isolation regions 17/16, which extend in the X or the row direction. The distance between adjacent stripes can be a size determined by the needs of the device to be fabricated. After mask regions 34 are imaged onto the active regions 17 (shown in FIG. 3A), the photo resist 23 in the exposed masking regions is removed (i.e. stripes in the row direction), leaving rows of the nitride layer 26 exposed. The exposed nitride layer portions are removed using a nitride anisotropic etch process until the poly layer 14 is observed, which acts as an etch stop. The portions of layers 12, 14 and 22 still underneath the remaining photo resist 23 are unaffected by this etch process. It will become evident from the following description that the process of the present invention creates columns of multiple pairs of mirror memory cells. For each such pair of memory cells, this nitride etch process results in the formation of a single first trench 26 that extends down to polysilicon layer 14, as shown in FIG. 3B.

Figure 4B:
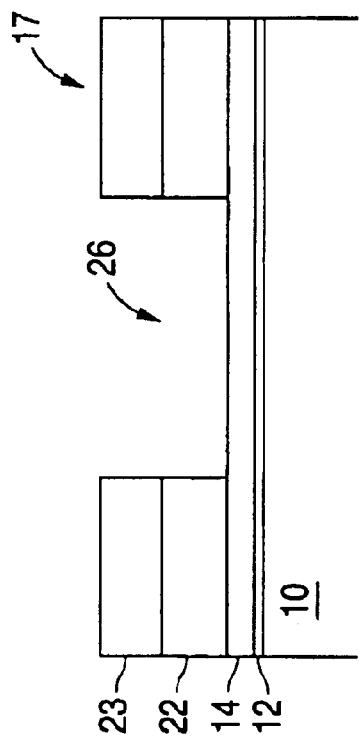

The mask regions 32 each include a single transparent linear aperture into which a pair of opaque L shaped members 35 protrude. Members 35 extend out from opposing sides of aperture 31, and bend toward each other, to form an 'H' shaped aperture (the shape in the form of the letter 'H' can be seen by rotating FIG. 5 by 90 degrees). Mask regions 32 are used to define WL strap cells in the strap regions 24 that are each aligned to one of the rows of memory cells in the array. The mask regions 32 are imaged onto the strap regions 24, where an 'H' shaped trench pattern is formed in each row of the strap regions 24 by the nitride anisotropic etch step. FIG. 4B illustrates the cross section view of the strap regions 24 after the nitride etch step, that are imaged by the line 4B—4B portion of the 'H' shaped mask pattern of FIG. 5. The two parallel portions of the 'H' shaped pattern result in the formation of a pair of trenches 40 in the strap regions 24, as shown in FIG. 4B.

The mask regions 33 each include a single linear aperture for forming the SL strap cells in the strap regions 24. Each SL strap cell is aligned to one of the rows of memory cells in the array. The mask regions 33 are each imaged down onto the structure between one of the 'H' shaped trench patterns and one of the rows of memory cells, as later described and illustrated.

Figure 3C:
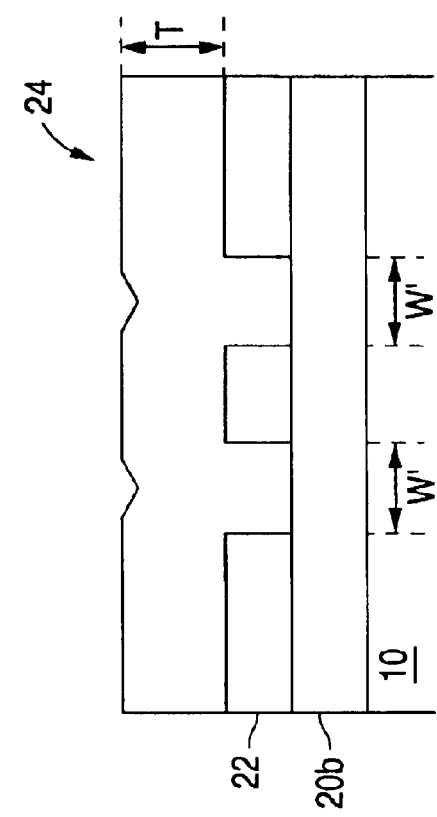
Figure 3D:
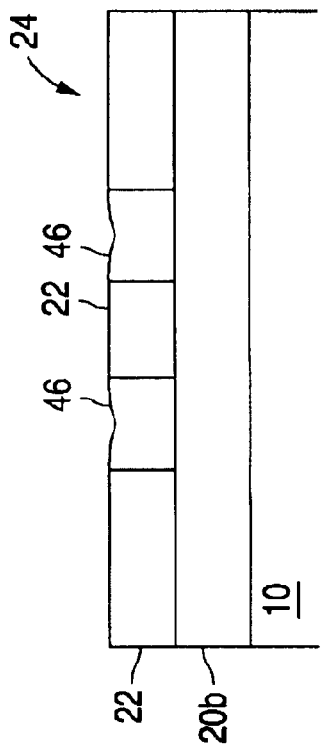

The residual photo-resist 23 is removed from the structure, which is followed by an oxidation process. For the active region 17, this oxidation process oxidizes the exposed portions of poly layer 14 inside of trenches 26 to form a lens shaped oxide layer 42 over poly layer 14 (see FIG. 3C). While not shown, an optional poly etch process can be performed before the formation of layer 42. This optional customized anisotropic poly etch process etches away a portion of the top surface of poly layer 14, but leaves a taper shape in that top surface in the area next to the remaining nitride layer 22. Oxide spacers 44 are then formed inside trenches 26. The formation of spacers is well known in the art, and includes depositing a material over the contour of a structure (as shown in FIG. 3C), followed by an anisotropic etch process (e.g. RIE), whereby the material is removed from horizontal surfaces of the structure, while the material remains largely intact on vertically oriented surfaces of the structure. To form oxide spacers 44, a thick layer of oxide is deposited over the structure, followed by an anisotropic oxide etch, which removes the deposited oxide except for spacers 44 inside trenches 26. This oxide etch step also removes the center portion of oxide layer 42 from each of the trenches 26. The oxide etch step uses the nitride layer 22 as the etch stop. The resulting structure in the active region 17 is shown in FIG. 3D.

Figure 4C:
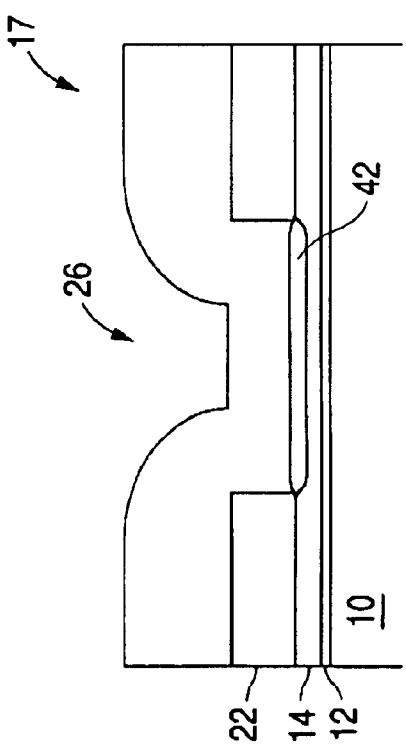
Figure 4D:
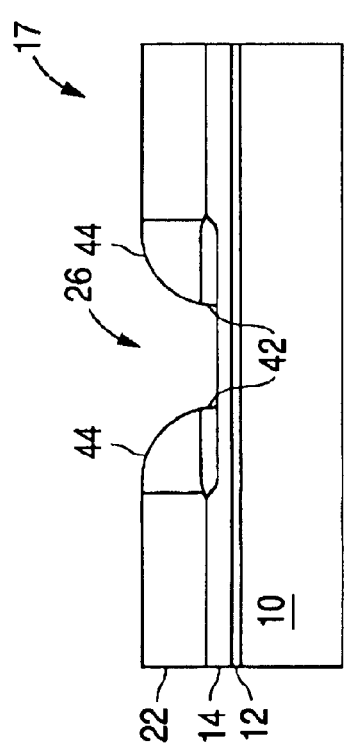

For the strap region 24, the oxidation process used to form oxide layer 42 in the active region 17 has no affect. The oxide deposition and etch steps used to form spacers 44 in the active region end up filling trenches 40 in the strap region 24 with oxide to form oxide blocks 46. Specifically, the oxide deposition completely fills trenches 40 (see FIG. 4C) and the oxide etch removes the oxide outside of trenches 40 (see FIG. 4D). Trenches 40 are filled solid with oxide instead of with oxide spacers along their sidewalls so long as trenches 40 have a sufficiently narrow width W'. For example, in many applications, if the width W' of each trench 40 is no greater than approximately twice the thickness T of the deposited oxide, then the trenches 40 will be filled with oxide to form oxide blocks 46. Therefore, for the preferred embodiment, the width of the trenches in the trench pattern formed by imaging patterned aperture onto the strap region 24 is narrow enough to ensure that the trench pattern is filled with oxide by the oxide deposition/etch steps.

Figure 3E:
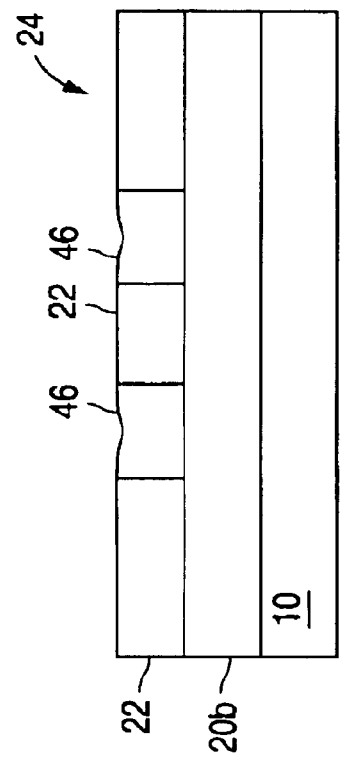
Figure 4E:
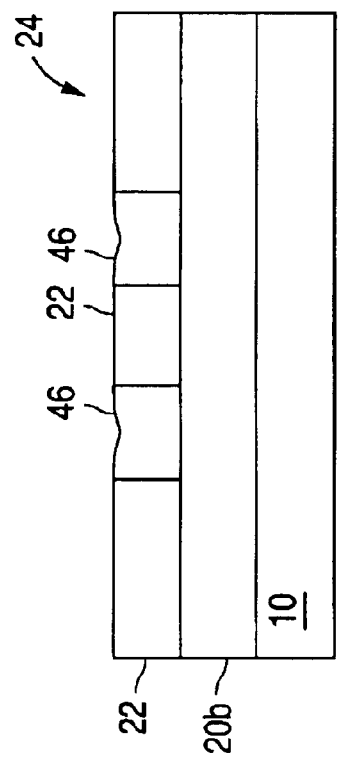

An anisotropic poly etch process is then performed on the structure. For the active region 17, this etch removes portions of the poly layer 14 that are exposed between the opposing insulation spacers 44 at the bottom of trenches 26. The oxide layer 12 acts as an etch stop. This poly etch has no effect on the strap region. A thin oxide etch is then performed, which removes the exposed portions of thin oxide layer 12 between spacers 44 at the bottom of trenches 26 to expose substrate 10. The use of spacers 44 allows the formation of trenches 26 having a width at the poly layer 14 that is less than the width of the masking step used to initially define the tops of trenches 26. The resulting active region structure is illustrated in FIG. 3E. The oxide etch removes a negligible amount of the oxide blocks 46 in strap region 24, as shown in FIG. 4E.

Figure 3F:
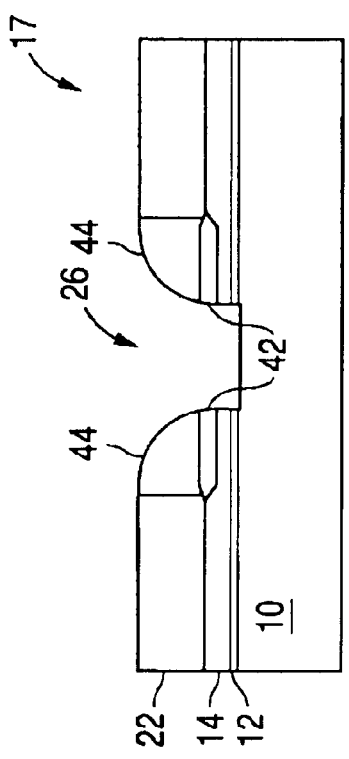
Figure 4F:
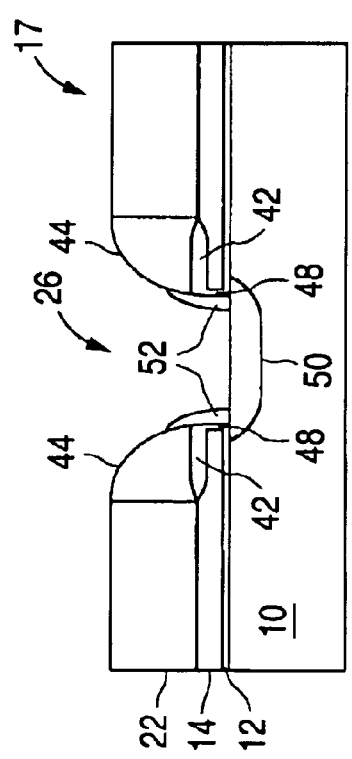

An oxidation step is then performed, where in the active region 17, the sides of polysilicon layer 14 and the substrate surface that are exposed inside trenches 26 are oxidized to form oxide side walls 48 on the sides of poly layer 14 and to reform oxide layer 12 over the substrate 10 exposed inside trenches 26. Suitable ion implantation is then made across the entire surface of the structure. Where the ions have sufficient energy to penetrate the oxide layer 12 in trenches 26, they then form a first region (i.e. source region) 50 in the substrate 10. In all other regions, the ions are absorbed by the existing structure, where they have no effect. Insulation (e.g. oxide) spacers 52 are then formed inside trenches 26 by depositing a layer of oxide, followed by an anisotropic oxide etch, which removes the deposited oxide except for spacers 52. This oxide etch step also removes the center portion of oxide layer 12 from each of the trenches 26 to re-expose the substrate 10. The resulting active region structure is shown in FIG. 3F. The above described oxidation, ion implantation, and oxide deposition/etch steps have no appreciable net affect on the strap region structure 24, as shown in FIG. 4F.

Figure 3G:
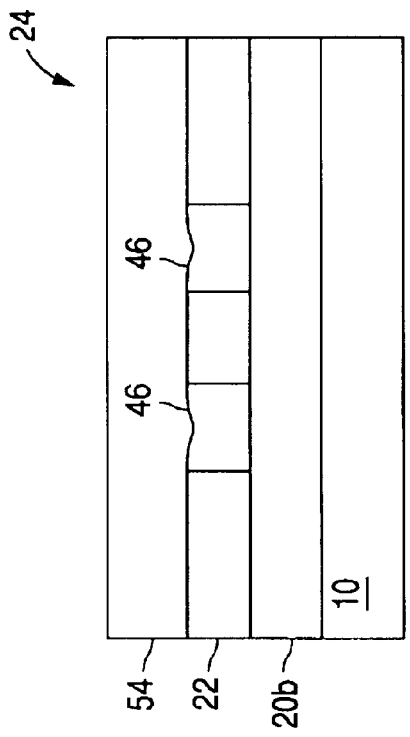
Figure 4G:
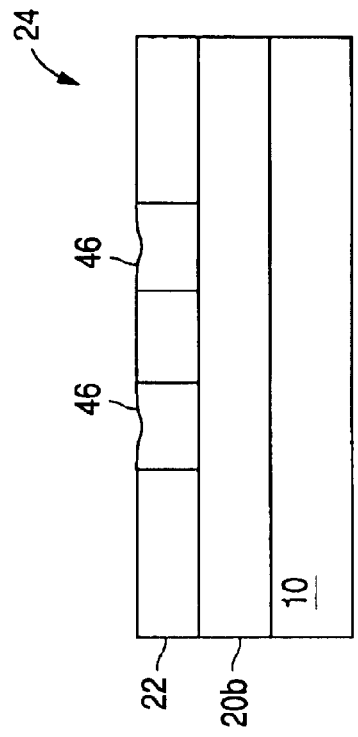
Figure 3H:
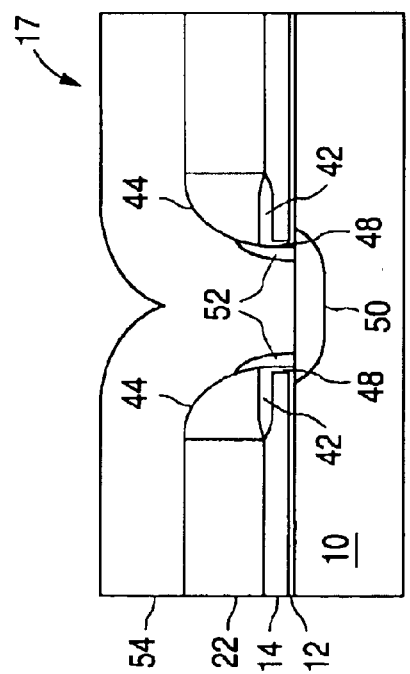
Figure 4H:
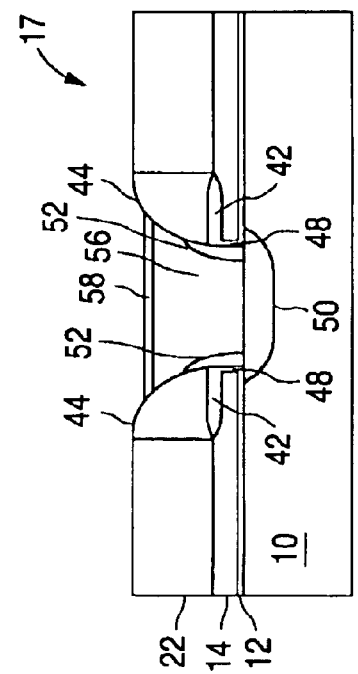

A poly deposition step is then performed, leaving a thick layer 54 of polysilicon over the active region 17 and strap region 24, as shown in FIGS. 3G and 4G, respectively. A poly planarization step follows (preferably CMP), which etches the poly layer 54 down to nitride layer 22, leaving poly blocks 56 in trenches 26 (in the active region 17). A poly etch-back step follows to recess the top portion of poly blocks 56 below the tops of trenches 26, to remove any excess polysilicon outside of trenches 26 (and any polysilicon remaining in the strap region 24). The polysilicon is properly doped either through an in-situ method or by conventional implantation. An oxide layer 58 is then formed by oxidizing the top portions of poly blocks 56, which has no affect on strap region 24. The resulting active region structure is shown in FIG. 3H, and the resulting strap region structure is shown in FIG. 4H.

Figure 3I:
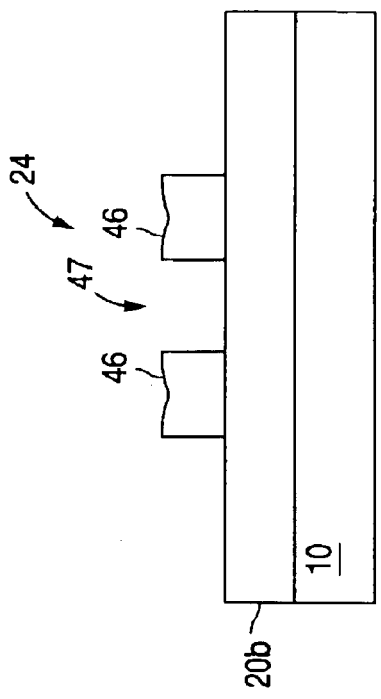
Figure 4I:
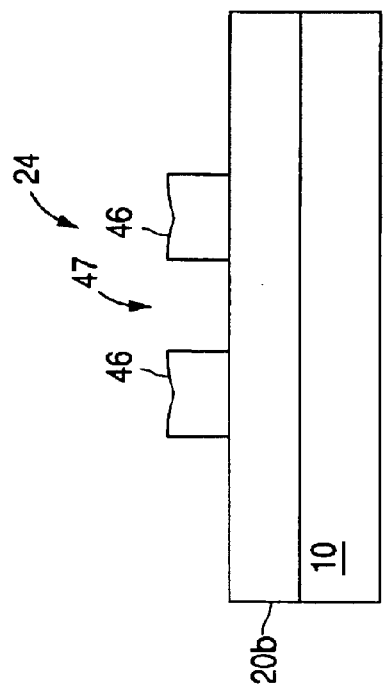
Figure 3J:
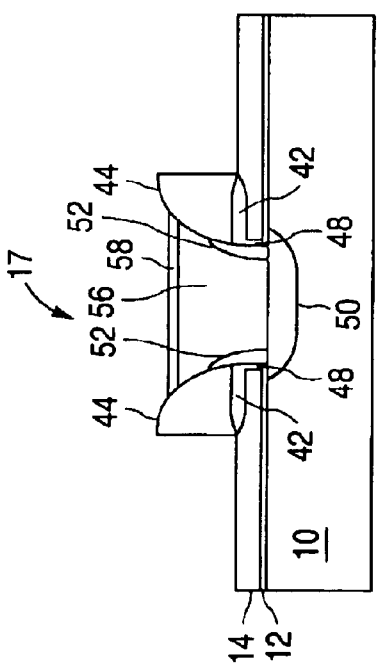
Figure 4J:
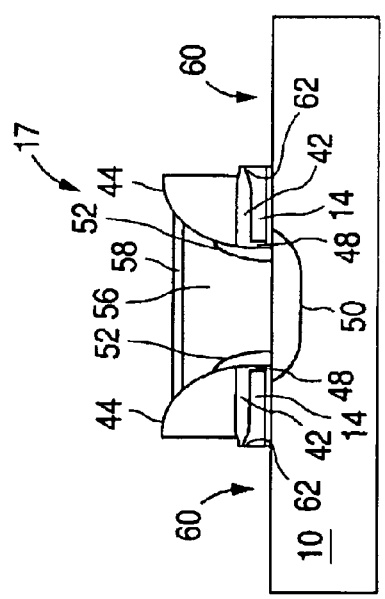

A nitride etch is then performed to remove nitride layer 22 from both the active region 17 and the strap region 24, as shown in FIGS. 3I and 4I. An anisotropic poly etch follows to remove the portion of poly layer 14 not covered by oxide spacers 44 and oxide layer 58 in the active region 17 (FIG. 3J). The poly etch has no affect on the strap region 24 (FIG. 4J). The nitride and poly etch steps effectively create second trenches 60, one on either side of the mirror pair of memory cells in the active region 17, as well as upwardly projecting sharp edges 62 on side edges of poly layer 14. A controlled isotropic oxide etch is then performed, to remove exposed portions of oxide layer 12, and to remove a small portion of spacers 44 directly over the sharp edges 62. This oxide etch has a negligible effect on the strap region 24. The resulting structures are shown in FIGS. 3J and 4J.

Figure 4K:
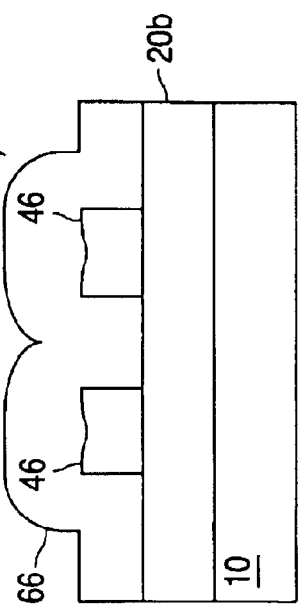
Figure 3K:
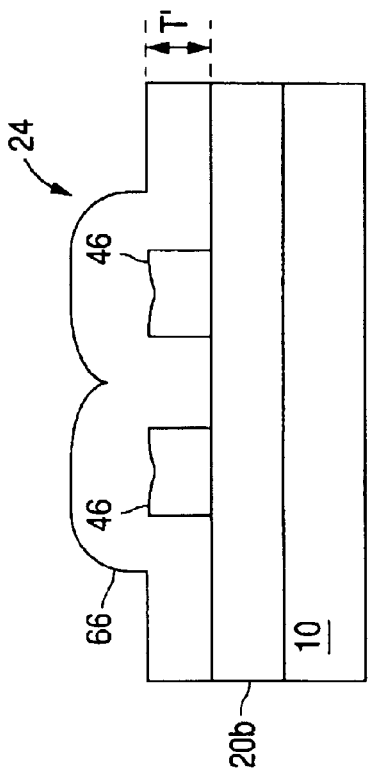

The next step is an oxidation process, which forms an oxide layer on the exposed ends 64 of poly layer 14 (strap region 24 unaffected). Oxide layer 64 joins with oxide layer 42 in forming an insulation layer that is disposed adjacent to and over the polysilicon layer 14. The sharp edges 62 and the thickness of the insulation layer formed by oxide layers 64/42, permit Fowler-Nordheim tunneling of charges therethrough. The oxidation process also re-forms oxide layer 12 over the exposed portions of the substrate 10. The deposition of a thick poly layer 66 over the active region and strap region structures follows, as illustrated in FIGS. 3K and 4K.

Figure 4L:
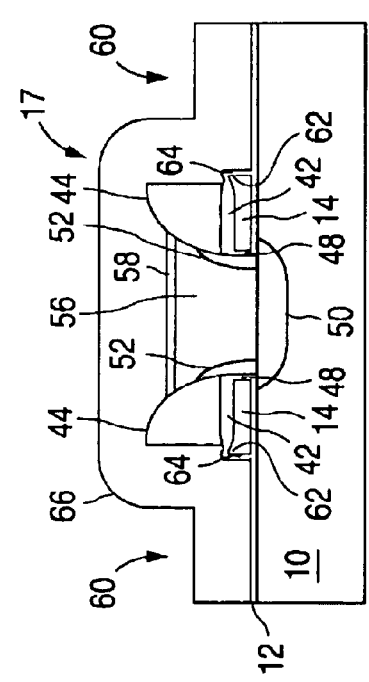

While not shown in the above figures, at least one peripheral region 130 of the substrate 10 is disposed adjacent to the memory cell array. Logic devices, are formed in the peripheral region that relate to the operation of the memory cell array. For the purposes of the present invention, logic devices include low or high voltage MOS FET's, and passive elements such as capacitors or resistors. As shown starting with FIG. 3L, the peripheral region 130 is preferably separated from one of the active regions 17 by an isolation region 132 (such as STI isolation as described above) formed in the substrate 10. Poly layer 66 formed over the active region 17 extends over the peripheral region 130. FIG. 4L illustrates the same strap region 24 as shown in FIG. 4K.

Figure 3L:
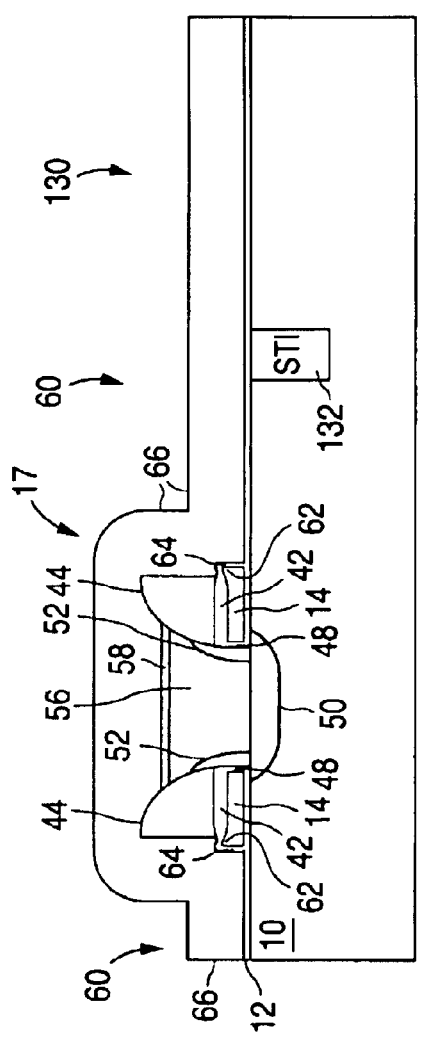
Figure 4M:
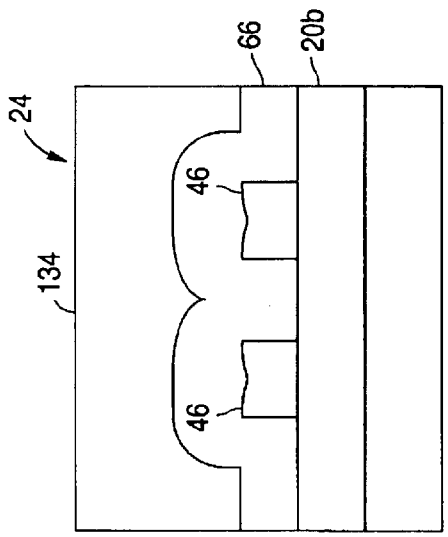
Figure 4N:
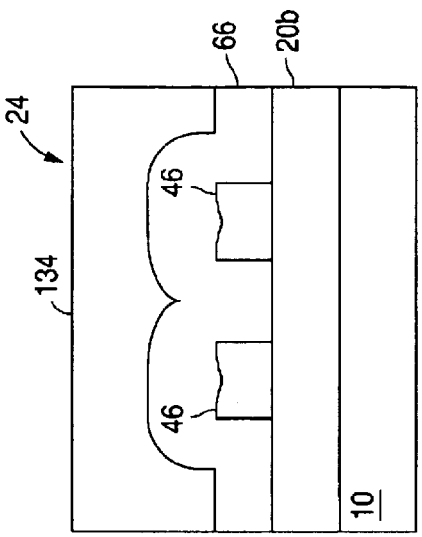
Figure 3M:
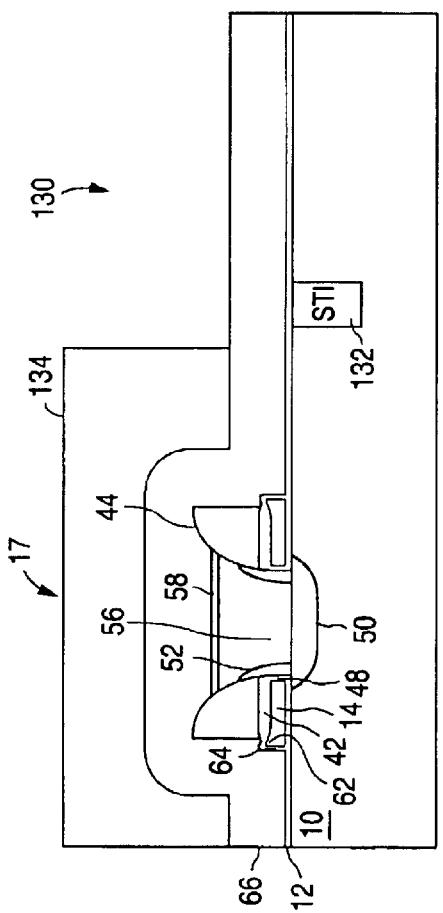
Figure 3N:
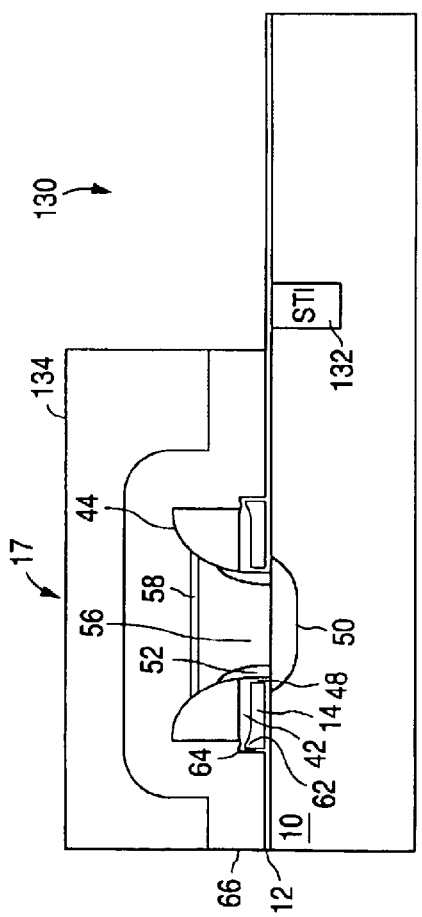

A masking step is performed, where photo resist is formed over the structure, and removed only from the peripheral region 130, leaving photo resist 134 disposed over active region 17 and the strap region 24, as shown in FIGS. 3M and 4M. A poly (anisotropic) etch process is then performed to remove the exposed portion of poly layer 66 in the peripheral region 130 (using oxide layer 12 as an etch stop). The portions of poly layer 66 protected by the photo resist 134 in the active and strap regions 17/24 are unaffected by the poly etch step, as shown in FIGS. 3N and 4N.

Figure 4O:
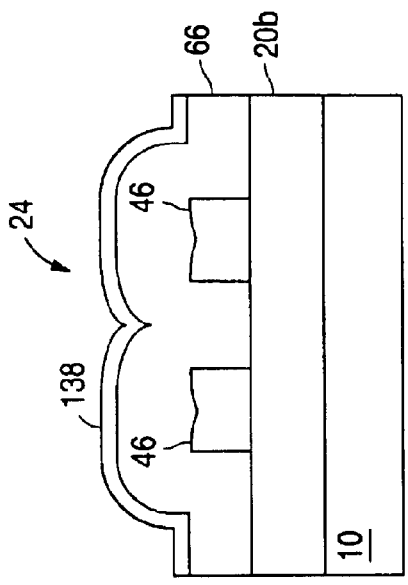
Figure 3O:
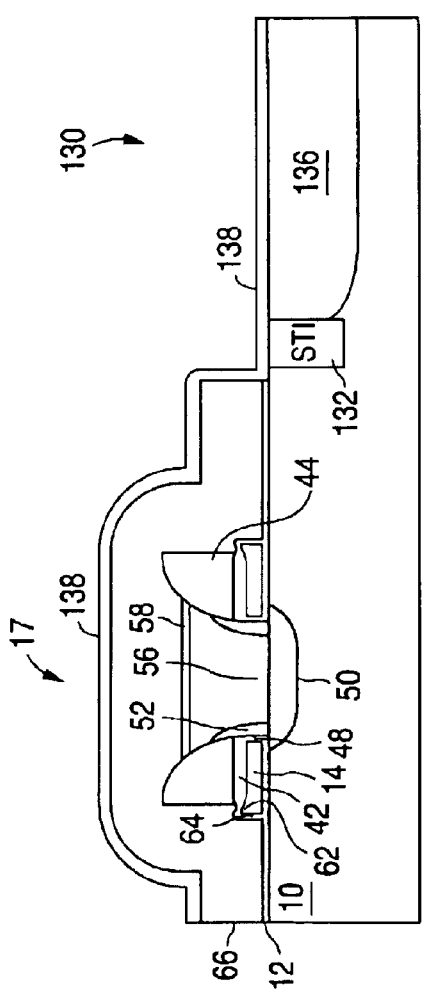

After the photo resist 134 is removed, a well region 136 is formed in the peripheral region 130 of substrate 10 by masking the structure except for the peripheral region 130, and performing suitable ion implantation (i.e. well implant, punch through implant and Vt implant) through oxide layer 12 to form one or more well regions 136 as shown in FIG. 3O. In the preferred embodiment, well region 136 is N type. A separate and similar masking step can be employed to form a p-type well. The masking material is then removed, followed by an oxide etch that removes the exposed portions of oxide layer 12 from the peripheral region 130 (using the substrate 10 as an etch stop). An oxide layer 138 is formed on the exposed surfaces of the structure. The portion of oxide layer 138 in the peripheral region 130 will form the gate oxide of the logic devices formed therein, and thus oxide layer 138 will have a thickness appropriate for the voltage requirements of such logic devices. The resulting structures in the active, peripheral and strap regions are shown in FIGS. 3O and 4O.

Figure 4P:
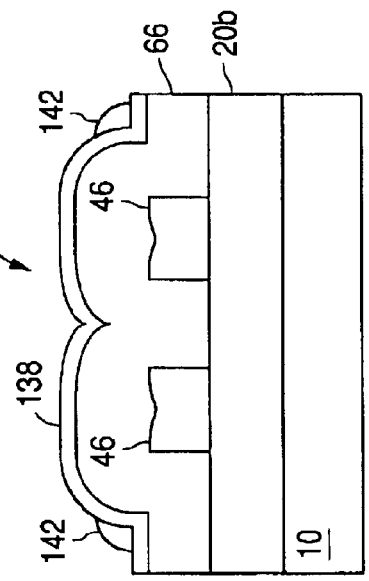
Figure 3P:
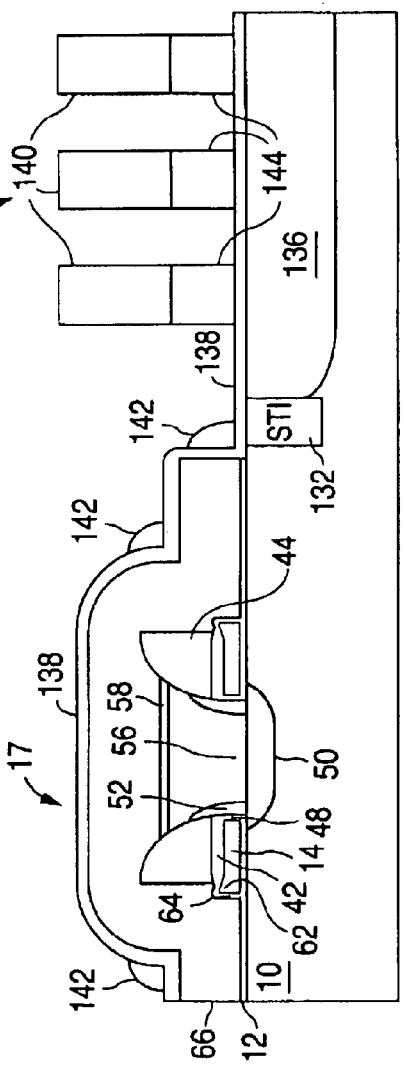

A layer of polysilicon is next deposited over the structure, following by photo resist 140 formed over the polysilicon layer. A masking step is then used to remove the photo resist 140 except for locations under which transistor (logic) gates are to be formed in the peripheral region 130. A dry poly etch process is then used to remove the deposited poly layer except for poly spacers 142 adjacent vertical portions of oxide layer 138, and poly blocks 144 underneath the remaining portions of photo resist 140. Poly spacers 142 are conductive residue that should be removed to prevent electrical shorts in the device, and poly blocks 144 form the logic (transistor) gates of the logic devices formed in the peripheral region 130. The resulting structures are shown in FIGS. 3P and 4P.

The remaining photo resist 140 is removed. New photo resist 146 is formed over the structure. A masking step is used to remove the photo resist 146 except for over the peripheral region 130. A poly etch process is then used to remove any polysilicon residues, including poly spacers 142, as shown in FIGS. 3Q and 4Q.

A wet oxide etch is performed to remove oxide layer 138 from the active region 17 and the strap region 24. A poly etch (RIE) follows, which removes poly layer 66 from the active region 17 except for poly spacers 68 next to oxide spacers 44, as shown in FIG. 3R. In the strap region 24, the poly etch removes poly layer 66 except for poly spacers 70 next to oxide blocks 46, and poly block 72 between oxide blocks 46, as shown in FIG. 4R. The width W" between the oxide blocks 46 needs to be small enough compared to the thickness of the deposited polysilicon 66 so that poly block 72 fills the space between oxide blocks 46 and has a planar upper surface after the poly etch process. Specifically, width W" should be no greater than approximately twice the thickness T' of the deposited polysilicon, as shown in FIGS. 4K and 4R.

Photo resist 146 is then removed. Nitride is deposited over the structures, followed by an anisotropic nitride etch (such as RIE dry etch) to remove all the deposited nitride except for spacers 74 adjacent poly spacers 68 in the active region 17 (FIG. 3S), spacers 75 adjacent poly blocks 144 in the peripheral region 130 (FIG. 3S), and spacers 76 adjacent to poly spacers 70 in the strap region 24 (FIG. 4S). The peripheral region 130 is masked with photo resist while ion implantation (e.g. N+) is then used to form second regions (i.e. drain regions) 78 in the active region substrate in the same manner as the first regions 50 were formed. Then, the active region 17 is masked with photo resist while ion implantation (e.g. P+) is then used to form source and drain regions (third and fourth regions) 122/124 in the well region 136 in a similar manner as the first region 50 was formed, as shown in FIG. 3S. The first and second regions 50/78 have a conductivity type (e.g. N type) that is different from that of the substrate 10. Likewise, third and fourth regions 122/124 have a conductivity type (e.g. P type) that is different from that of the well region 136. These ion implantations have no effect on the strap region 24, as shown in FIG. 4S.

A thin oxide etch is performed to remove exposed portions of oxide layers 12 and 138 over the substrate in the active and peripheral regions 17/130, and the oxide layer 58 over poly bock 56 (no appreciable effect in strap region 24). A metal deposition step is then performed, to deposit a metal such as tungsten, cobalt, titanium, nickel, platinum, or molybdenum over the active, peripheral and strap region structures. The structures are then annealed, permitting the hot metal to flow and to seep into the exposed top portions of the substrate 10 to form a conductive layer of metalized silicon 80 (silicide) on the substrate next to side wall spacers 74 and 75. Metalized silicon region 80 on substrate 10 can be called self aligned silicide (i.e. salicide), because it is self aligned to the second regions 78 by spacers 74 and to third/fourth regions 122/124 by spacers 75. The hot metal also forms a conductive layer of metalized polysilicon 82 (polycide) on the exposed top portions of poly spacers 68 (in active region 17), poly blocks 56 (in active region 17), poly blocks 144 (in peripheral region 130), poly spacers 70 (in strap region 24) and poly blocks 72 (in strap region 24). The rest of the metal deposited on the remaining structure is removed by a metal etch process.

Passivation, such as BPSG 84, is used to cover the structures. A masking step is performed to define etching areas over the second regions 78 (in active region 17) and the poly blocks 72 (in strap region 24). The BPSG 84 is selectively etched in the etching areas to create contact openings that are ideally centered over the second regions 78 and poly blocks 72. The contact openings are then filled with conductor metal contacts 86 and 102 by metal deposition and planarizing etch-back. The salicide and polycide layers 80/82 enhance conduction between the conductors 86/102 and the second regions 78 or poly blocks 72. In each of the active regions 17, a bit line 88 is added by metal masking over the BPSG 84 to connect together all the contacts 86 in the active regions. In the strap region, strap jumpers 90 are added by metal masking over the BPSG 84 to connect to contacts 102.

A metal source line strap 112 and a pair of metal word line straps 114 and 116 are formed over, and extend parallel to, each row of memory cells preferably by a similar metal masking process used to form bit lines 88. In the strap region, a metal via 118 is formed to connect the strap jumper 90 with the appropriate strap 112/114/116. The metal via 90 shown in FIG. 4S connects the strap jumper 90 with the word line strap 116. Metal straps 112/114/116, jumpers 90 and metal via's 118 are surrounded by an appropriate insulation material 120, such as oxide. The final active region memory cell structure is illustrated in FIG. 3S, and the final strap region structure is illustrated in FIG. 4S.

As shown in FIG. 3S, first and second regions 50/78 form the source and drain for each memory cell (those skilled in the art know that source and drain can be switched during operation). The channel region 92 for each cell is the portion of the substrate that is in-between the source and drain 50/78. Poly spacers 68 constitute the control gates, and poly layer 14 constitutes the floating gate. The control gates 68 have a lower first portion 94 that is disposed adjacent the floating gate 14 (insulated therefrom by oxide layer 64), and an upper second portion 96 that protrudes over the sharp edge 62 of floating gate 14. Floating gate 14 is disposed over part of the channel region 92, is partially overlapped at one end by the control gate 68, and partially overlaps the first region 50 with its other end. The process of the present invention forms pairs of memory cells that mirror each other, where each pair of memory cells shares a single source region 50. The non-volatile memory cells are of the split gate type having floating gate to control gate tunneling all as described in U.S. Pat. No. 5,572,054, whose disclosure is incorporated herein by reference with regard to the operation of such a non-volatile memory cell and an array formed thereby. Also shown in FIG. 3S are logic devices 148 formed in the peripheral region 130. The logic devices 148 include poly gates 144 disposed over the well region 136 and insulated therefrom by the gate oxide layer 138. The poly gates 144 selectively activate (i.e. turn on) channel regions 93 of substrate 10 disposed between third and fourth regions 122/124. Logic devices 148 are low voltage (e.g. ~3V) or high voltage (e.g. ~12V) MOS FET's, where the thickness of the oxide layer 138 and the implantation depth and concentration of the third and fourth regions 122/124 dictate the breakdown voltage of the logic devices 148.

Strap Regions

Figure 6A:
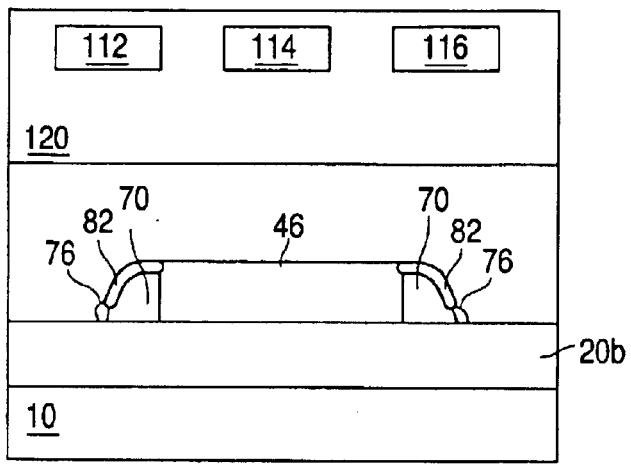
FIG. 6A is a cross sectional view of the completed strap region structure imaged by the line 6A—6A portion of the mask of FIG. 5.
Figure 6B:
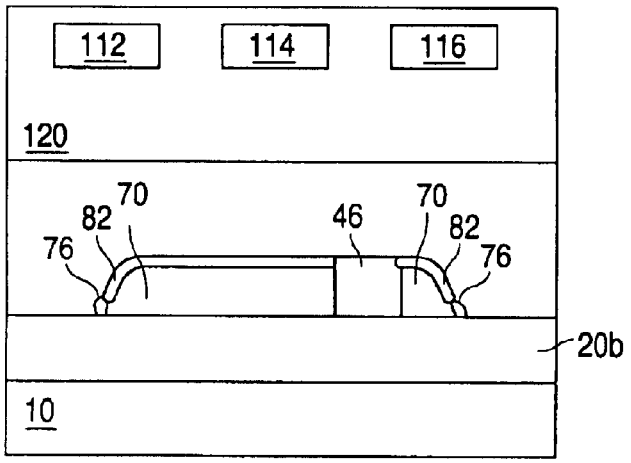
FIG. 6B is a cross sectional view of the completed strap region structure imaged by the line 6B—6B portion of the mask of FIG. 5.
Figure 6C:
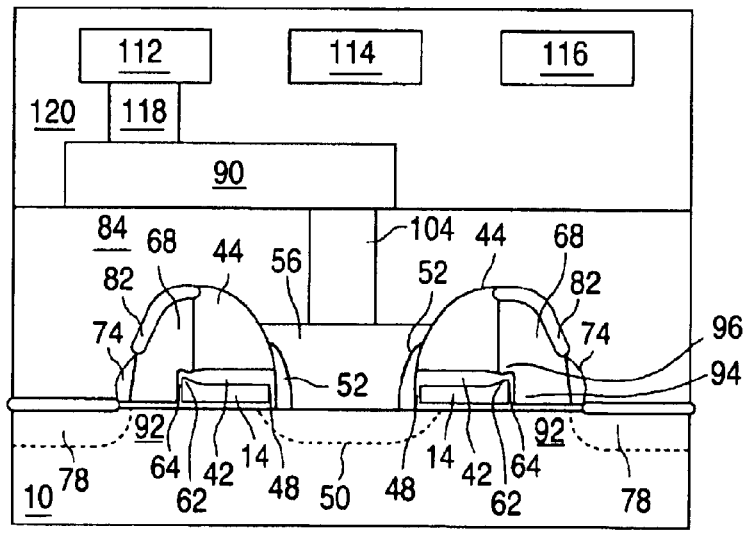
FIG. 6C is a cross sectional view of the completed strap region structure along the line 6C—6C of FIG. 7.
Figure 7:
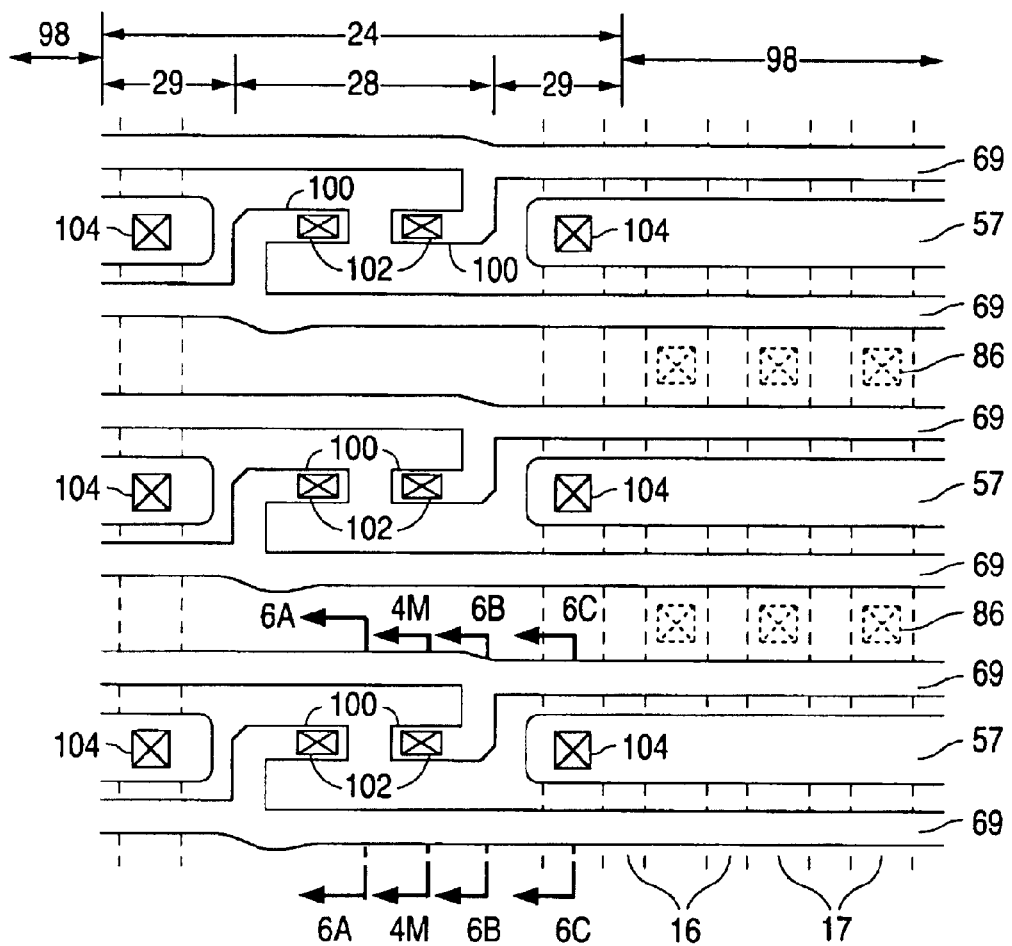
FIG. 7 is a top plan view of the strap cells and adjacent memory cell arrays of the present invention.

FIG. 4S is the final cross sectional view of one portion of the 'H' shaped trench pattern formed strap region 24 (corresponding to line 4B—4B of the mask 30 in FIG. 5). FIGS. 6A, 6B and 6C illustrate cross sections of other portions of the trench pattern formed in strap region 24, corresponding to lines 6A—6A, 6B—6B and 6C—6C, respectively, of mask 30 in FIG. 5, and as shown in FIG. 7. These figures illustrate, given the proper dimensions of mask 30, that conductive polysilicon is generally formed on those strap region portions imaged under the opaque portions of mask region 32, and silicon dioxide is generally formed on those strap region portions imaged under the transparent aperture portions of mask region 32.

Thus, the final layout of the structure is illustrated in FIG. 7. Columns of strap regions 24 are interlaced with columns of memory cell arrays 98, where the memory cell arrays 98 include columns of active regions 17 interlaced with columns of isolation regions 16. Each row in each strap region 24 includes a WL strap cell 28 disposed between a pair of SL strap cells 29, all aligned with one of the memory cell rows. The active regions 17 immediately adjacent to the WL strap cells 28 are actually dummy regions that do not contain any active memory cells, but rather are part of the strap region 24 and used to form the SL strap cells 29.

The control gates 68 for each row of memory cells are continuously formed as a single word line 69 that connects together all the control gates 68 in that row of memory cells. Each of the word lines 69 pass through the strap regions 24. An 'L' shaped contact lead 100 (corresponding to one of the 'L' shaped members 35 of mask 30) extends from each of the word lines 69 toward the center of the WL strap cell 28, and terminates with the electrical contact 102 formed thereon. Each of the word line straps 114/116 extend parallel to one of the word lines 69, with intermittent electrical contact therebetween in the strap regions 24 by metal contacts 102, metal jumpers 90 and metal via's 118. The metal word line straps 114/116 ensure that a substantially even voltage is applied along the entire length of each of the word lines 69.

The poly blocks 56 (disposed over source regions 50) for each row of memory cells pairs are continuously formed as a single source line 57 that connects together all the poly blocks 56 (and source regions 50 connected thereto) in that row of memory cell pairs. Each of the source lines 57 terminate in the SL strap cells 29, and do not pass through the strap regions 24. Instead, each source line 57 terminates with an electrical contact 104 formed near the center of the SL strap cell 29 in a similar manner as the bit line contacts 86, as shown in FIG. 7. The metal source line straps 112 connect together the contacts 104 in the strap cells 29 through metal via 118 and metal strap jumper 90. In the preferred embodiment, the metal source line straps 112 each extend parallel to source lines 57, with contact to the underlying source line 57 by contacts 104 in strap cells 29. Alternately, source line straps 112 could simply extend from one SL strap cell 29, over or around the WL strap cell 28, to the other SL strap cell 29 in the same strap region 24. In any event, word line straps 114/116, source line straps 112, and bit lines 88 are all metal conduit that are three-dimensionally configured (lateral spacing and height above the memory cell array) in and above the BPSG so as to not interfere with each other, yet each connect between with the appropriate voltage source and strap regions with minimal space requirements.

Figure 8:
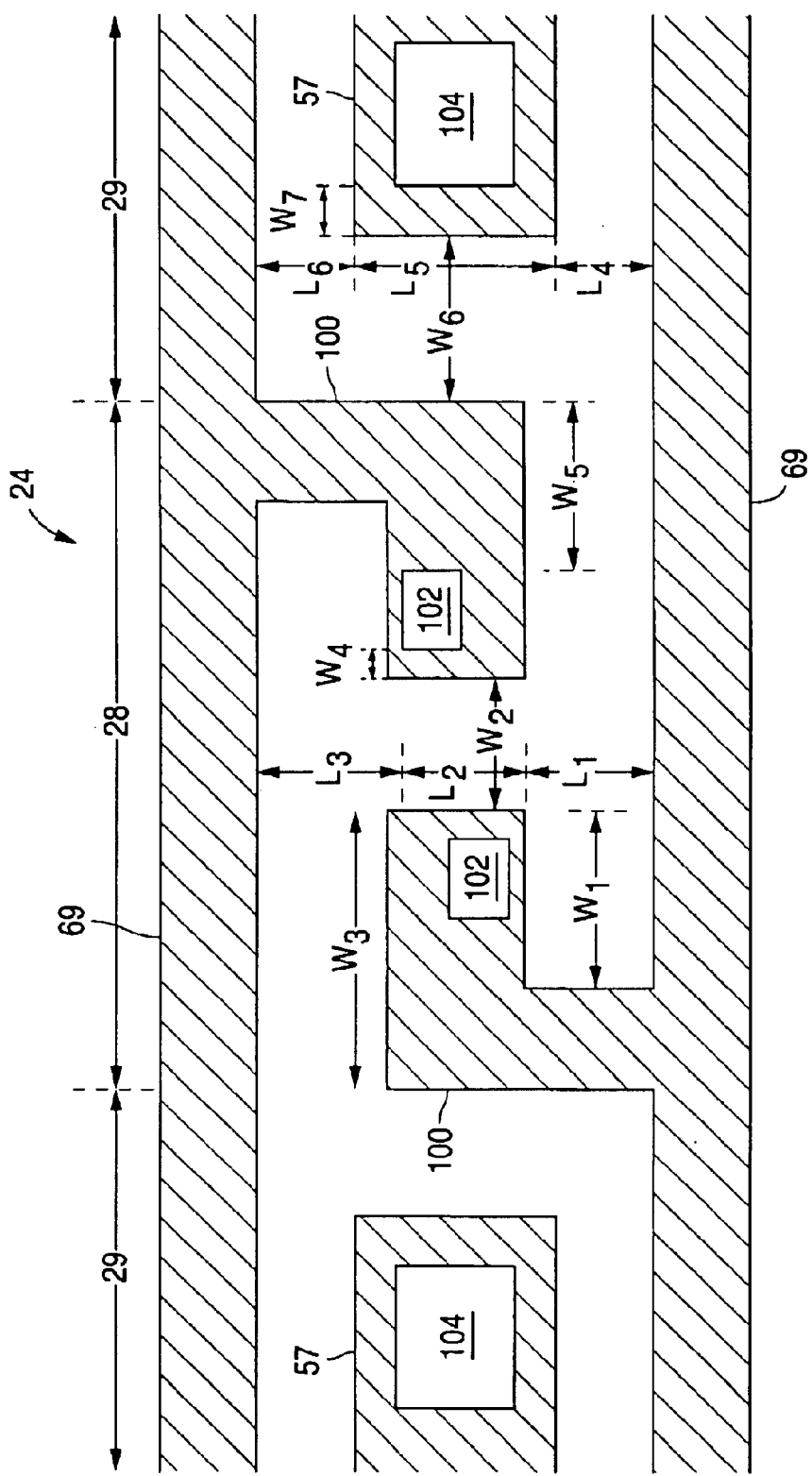
FIG. 8 is a top plan view of a WL strap cell and SL strap cell structure of the strap region of the present invention.

FIG. 8 illustrates various dimensions of the strap region 24 that can be optimized to best form electrical contacts 102 and 104 without shorting the word lines 69 to each other, or to the source line 57. W1 to W7 (and L1 to L6) are ideally set so any inadvertent horizontal (and/or vertical) shifts of any of the strap region elements would not result in an improperly formed contact or an inadvertent short. However, certain dimensions must be small enough to prevent the formation of the source line 57 in the strap region 24. For example, for many applications, the dimensions between conductive elements (e.g. L1, L3, W2) should be no greater than approximately twice the thickness T of the insulation layer deposited to form the insulation therebetween. Thus, the deposited insulation is not removed by subsequent etch steps to prevent the formation of conductive material in these regions.

Figure 1:
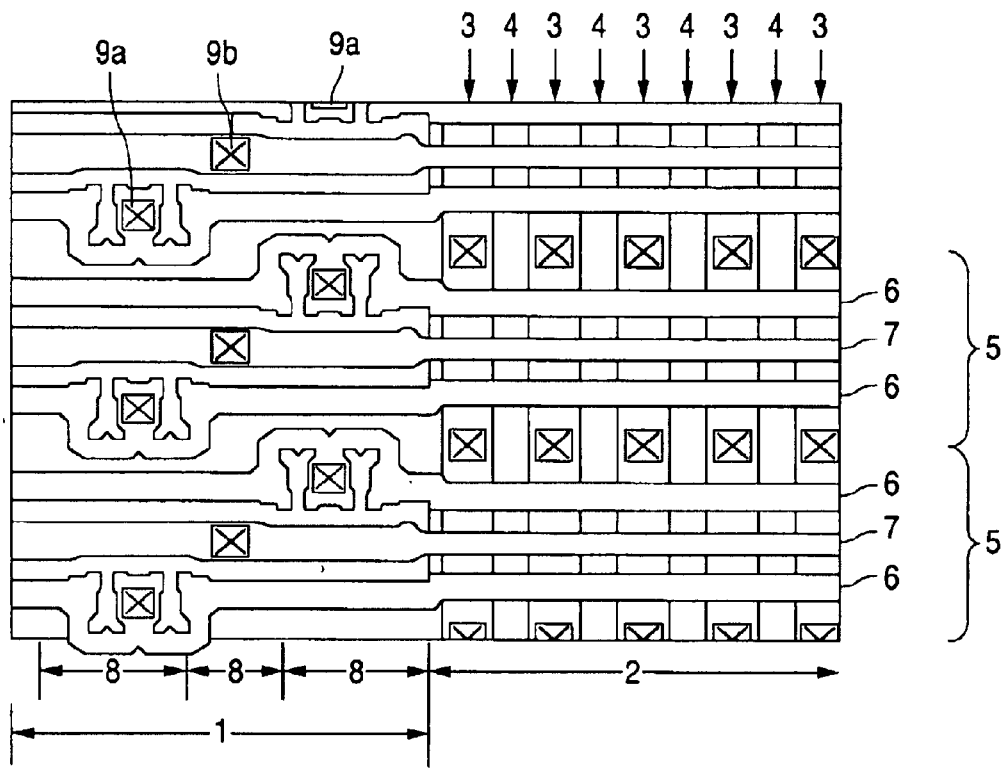
FIG. 1 is a top view of an array of non volatile memory cells, and a conventional strap region formed adjacent thereto.

With the present invention, additional room is made within the strap regions 24 because the source lines 57 do not traverse therethrough. This additional room allows the strap cells 28 and contacts formed therewith to be formed within the "effective width" of the memory cell row, and even along the row centerlines, as opposed to extending out toward adjacent memory cell rows as shown in FIG. 1. The "effective width" of a memory cell row is the distance (in the Y direction) taken up by the conductive memory cell components (e.g. floating gate, source line, control gate or control line, etc.) formed above the substrate. Thus, for the mirror cells illustrated in the figures, the "effective width" of each row is the distance between the two word lines 69 in each row of memory cells (distances $L_4$, $L_5$ and $L_6$) plus the widths of the two word lines 69 themselves. This is important because the word line electrical contacts 9a in FIG. 1 had to be formed outside of the effective width of the corresponding row of memory cells. As a result, the scaling down of the memory cell array along the "Y" direction was consequently prohibited because extra (wasted) space between memory cell rows was necessary to leave room for these electrical contacts. The present invention removes this constraint by allowing strap cells 28 to be formed within the effective width of the memory cell row, and in some embodiments even within the distance between pairs of word lines in each row, to form rows of memory cells in the array that are closer together (in the Y direction). Further, for any given size strap cell region 24, the extra room allows contacts 102 to be formed further apart to reduce the risk of shorting word or source lines together. Finally, the extra room within the strap regions 24 allows them, and the memory cell array as whole, to be safely scaled down in size in both the X (row) and Y (column) directions.

It should be noted that by following the same concepts as demonstration above, other configurations of mask 30 can be used to form strap regions 24 according to the present invention. For example, FIGS. 9A, 10A, 11A and 12A are alternate embodiments of mask 30, where the patterned aperture 31 resembles an 'S' shape (FIG. 9A), a '$' shape (FIG. 10A), an 'I' shape (FIG. 11A), or a modified 'S' shape (FIG. 12A).

Figure 9A:
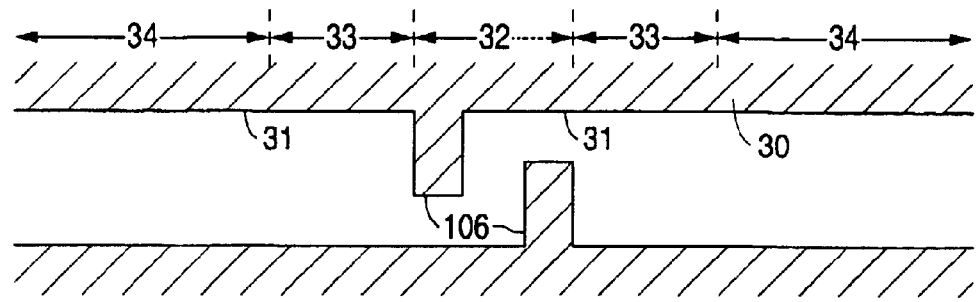
FIG. 9A is a top view of a first alternate embodiment of the mask, which is used to form the first trenches in the active regions and the 'S' shaped strap cell in the strap regions.
Figure 9B:
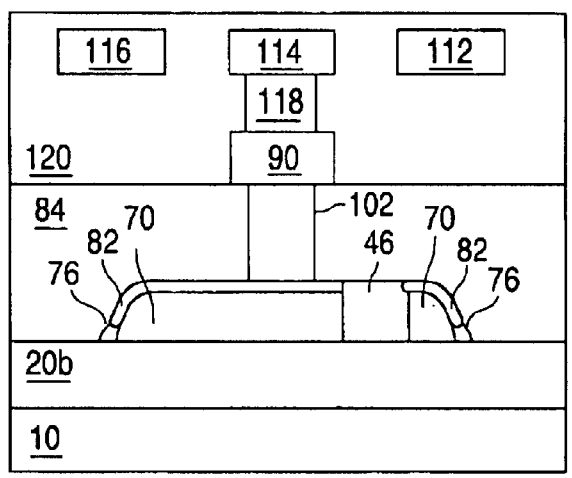
FIG. 9B is a cross sectional view of the 'S' shaped strap region structure along line 9B—9B in FIG. 9C.
Figure 9C:
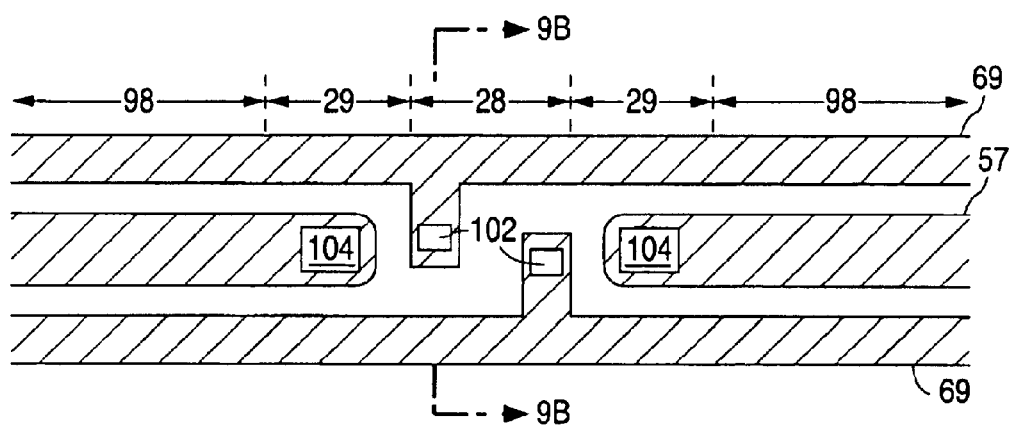
FIG. 9C is a top view of the 'S' shaped strap cell structure.

The 'S' shaped mask 30 of FIG. 9A includes a pair of tab members 106 that extend out from opposing sides of aperture 31 to form an 'S' shaped aperture. The cross-section of the resulting structure imaged under the tab members 106 is illustrated in FIG. 9B, and the resulting layout of the final structure is illustrated in FIG. 9C.

Figure 10A:
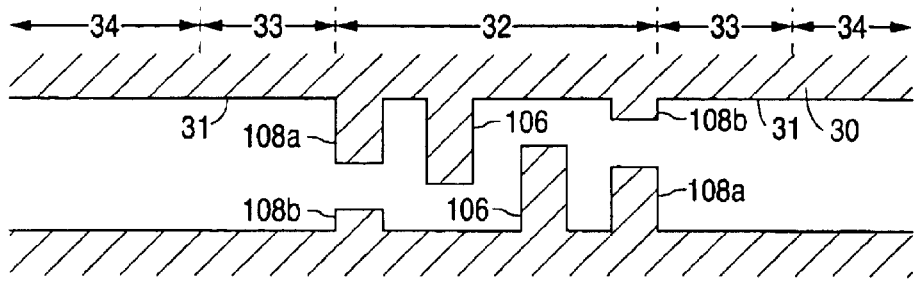
FIG. 10A is a top view of a second alternate embodiment of the mask, which is used to form the first trenches in the active regions and the '$' shaped strap cell in the strap regions.
Figure 10B:
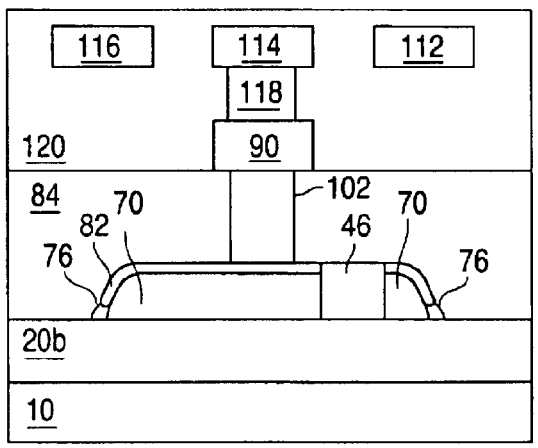
FIGS. 10B and 10C are cross sectional views of the '$' shaped strap region structure, along lines 10B—10B and 10C—10C respectively in FIG. 10D.
Figure 10C:
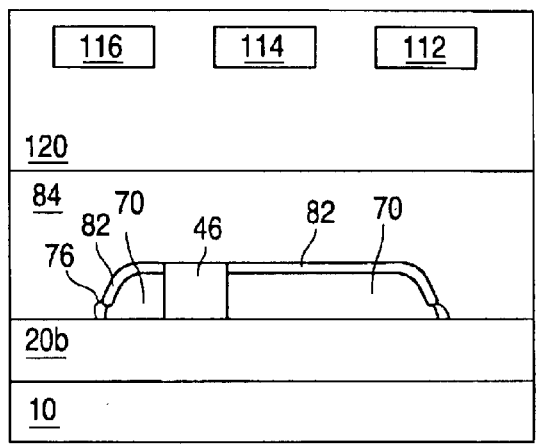
Figure 10D:
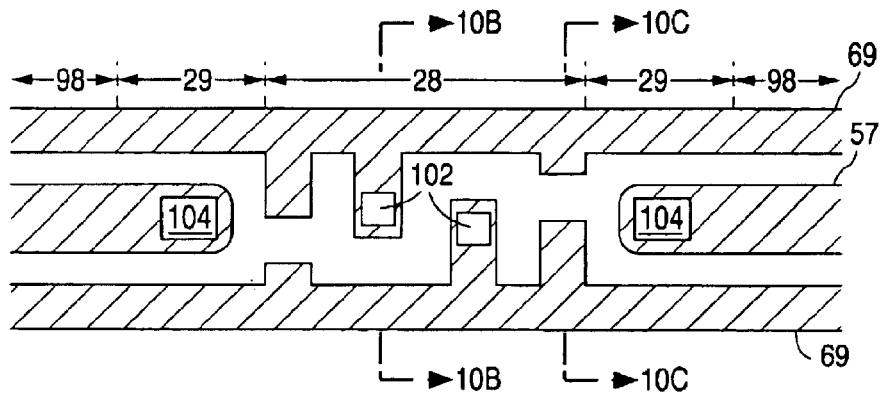
FIG. 10D is a top view of the '$' shaped strap cell structure.

The '$' shaped mask 30 of FIG. 10A is similar to that shown in FIG. 9A, but further includes opposing tab members 108a and 108b that extend out from opposing sides of aperture 31 to form a '$' shaped aperture 31. The cross-sections of the resulting structure imaged under the tab members 106 and under tab members 108a/b are illustrated in FIGS. 10B and 10C respectively, and the resulting layout of the final structure is illustrated in FIG. 10D.

Figure 11A:
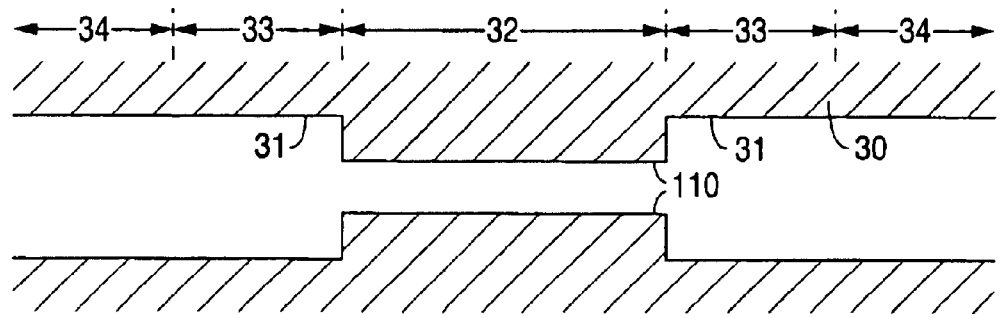
FIG. 11A is a top view of a third alternate embodiment of the mask, which is used to form the first trenches in the active regions and the 'I' shaped strap cell in the strap regions.
Figure 11B:
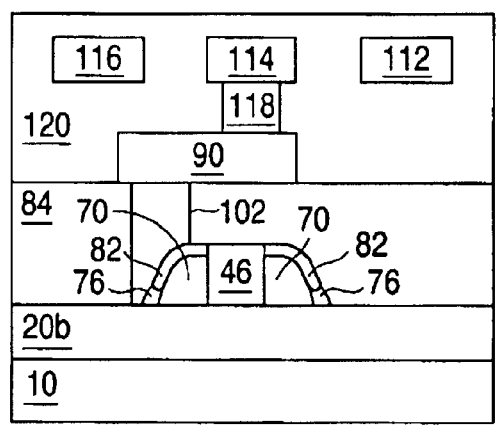
FIG. 11B is a cross sectional view of the 'I' shaped strap region structure, along line 11B—11B in FIG. 11C.
Figure 11C:
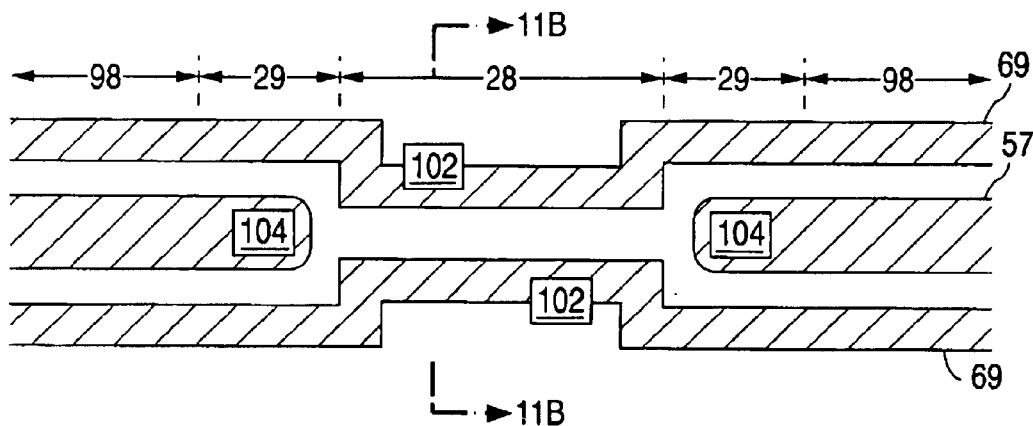
FIG. 11C is a top view of the 'I' shaped strap cell structure.
Figure 12A:
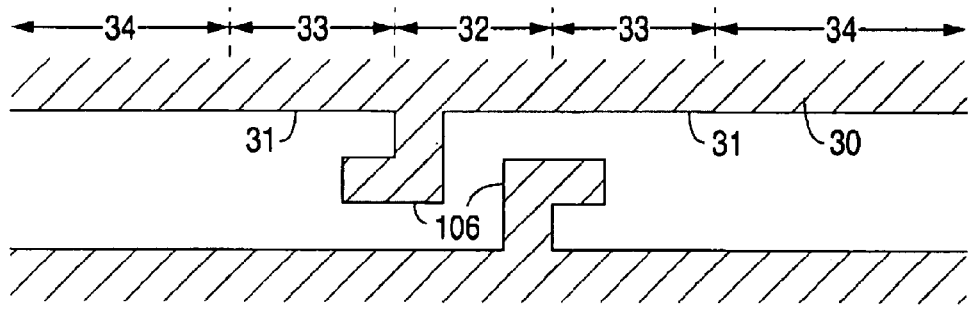
FIG. 12A is a top view of a fourth alternate embodiment of the mask, which is used to form the first trenches in the active regions and the 'S' shaped strap cell in the strap regions.

The 'I' shaped mask 30 of FIG. 11A includes a pair of directly opposing tab members 110 that extend out from opposing sides of aperture 31 to form an 'I' shaped aperture 31. The cross-section of the resulting structure imaged under the tab members 110 is illustrated in FIG. 11B, and the resulting layout of the final structure is illustrated in FIG. 1C.

Figure 12B:
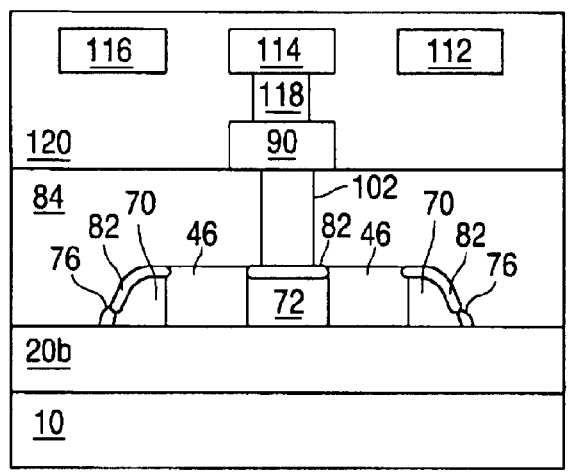
FIG. 12B is a cross sectional view of the 'S' shaped strap region structure, along line 12B—12B in FIG. 12C.
Figure 12C:
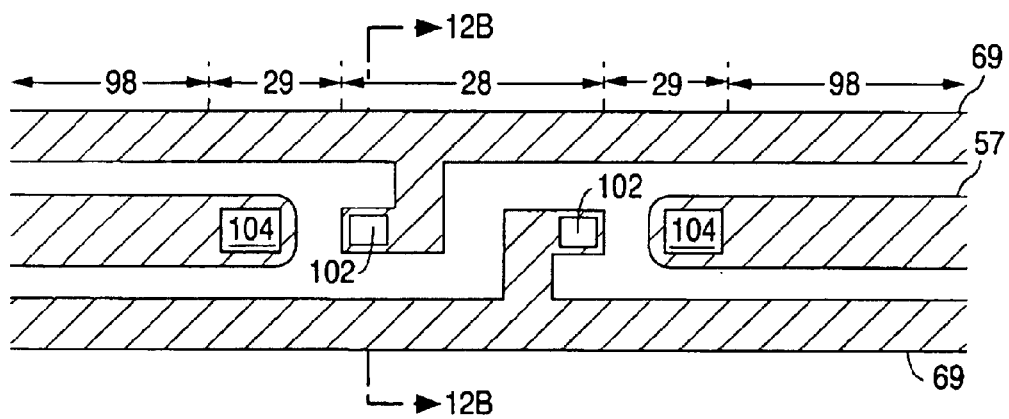
FIG. 12C is a top view of the 'S' shaped strap cell structure.

The modified 'S' shaped mask 30 of FIG. 12A includes a pair of 'L' shaped tab members 106 that are similar to the 'L' shaped tabs 35 shown in FIG. 5. The tabs 106 extend out from opposing sides of aperture 31, and then extend away from each other, to form an 'S' shaped aperture. The cross-section of the resulting structure imaged under the tab members 106 is illustrated in FIG. 12B, and the resulting layout of the final structure is illustrated in FIG. 12C.

Each of the masks shown in FIGS. 9A, 10A, 11A or 12A result in a strap region 24 which is not traversed by the source line 57, and provides locations for forming the word line and source line contacts 102/104 that are sufficiently spaced apart from each other and from other strap region elements.

Figure 13:
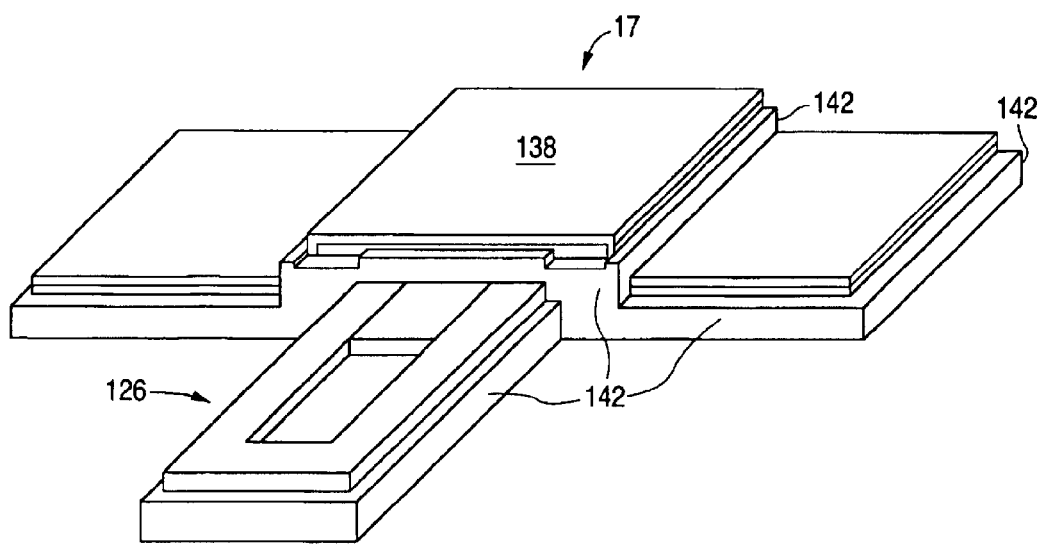
FIG. 13 is a perspective view of the active region structure of FIG. 3P.

FIG. 13 shows the three-dimensional topography of the active region structure of FIG. 3P, including the word line termination area 126 in which the source line 57 extends from the end of the row of memory cell pairs. The structure has two different levels upon which residual poly spacers 142 are formed, and need removal. Specifically, residual poly spacers 142 are formed over the substrate and over the poly layer 66 (insulated therefrom in both cases by oxide layer 138). Removal of residual polysilicon would be easier if the topography of the structure was simplified and resulted in the formation of as few as one residual poly spacer 146 for each row of memory cell pairs. The first alternate embodiment provides such a method and structure.

First Alternate Embodiment

FIGS. 14A–14K and 15A–15K illustrate a first alternate embodiment for forming the logic devices in the peripheral area 130 and the associated memory cells in the active region 17. In this embodiment, there is a reduction and simplification of the structure topography in the active region 17 earlier in the process, which minimizes the formation of unwanted residual polysilicon (i.e. poly stringers) that are formed in later process steps.

This first alternate embodiment starts with the structure shown in FIGS. 3L and 4L (reproduced in FIGS. 14A and 15A). A thick nitride layer 150 (~1500 Å) is formed over poly layer 66, as shown in FIGS. 14B and 15B. The entire structure is then planarized preferably employing a chemical-mechanical polishing (CMP) process that uses oxide 58 as a polishing stopper. As shown in FIG. 14C, the oxide spacers 44, poly layer 66 and nitride layer 150 in the active and peripheral regions 17/130 are polished down even with oxide layer 58, leaving nitride layer 150 covering poly layer 66 in the peripheral region 130 and partially covering poly layer 66 in active region 17. As shown in FIG. 15C, the oxide blocks 46, poly layer 66 and nitride layer 150 are polished down even with each other in the strap region 24, resulting in poly block 72 disposed between oxide blocks 46, and nitride layer 150 partially covering poly layer 66 on either side of the oxide blocks 46.

An oxidation process is performed to form a layer of oxide 152 on all exposed surfaces of poly layer 66 (i.e. adjacent oxide spacers 44 in the active region 17 and adjacent oxide blocks 46 in strap region 24) and poly block 72. A nitride etch process is used to remove all remaining portions of nitride layer 150, as shown in FIGS. 14D and 15D. A dry poly etch follows to remove all exposed portions of poly layer 66 which are not protected by oxide layer 152, leaving poly blocks 154 adjacent the oxide blocks 44 (in active region 17) and poly blocks 156 adjacent oxide blocks 46 (in strap region 24), as shown in FIGS. 14E and 15E.

A nitride layer 158 is formed over the active, peripheral and strap regions 17/130/24. A masking step is used to protect active and strap regions 17/24 while a nitride etch is used to remove nitride layer 158 from the peripheral region 130 only (as shown in FIGS. 14F and 15F). Once the masking material is removed, the well region 136 is formed in the peripheral region 130 of substrate 10 by masking the structure except for the peripheral region 130, and performing suitable ion implantation through oxide layer 12 (i.e. well implant, punch through implant and Vt implant) to form one or more well regions 136 as shown in FIG. 14F. In the preferred embodiment, well region 136 is N type.

After the masking material is removed, an oxide etch is used to remove the exposed portion of oxide layer 12 from the peripheral region 130 (using the substrate 10 as an etch stop). The gate oxide layer 138 is then formed on the exposed surface of the substrate 10 using a thermal oxide process, with a thickness that is appropriate for the voltage requirements of the logic devices. A layer of polysilicon is next deposited over the structure, following by the photo resist 140 formed over the polysilicon layer. A masking step is then used to remove the photo resist 140 except for locations under which transistor (logic) gates are to be formed in the peripheral region 130. A dry poly etch process is then used to remove the deposited poly layer except for residual poly spacers 142 adjacent vertical portions of nitride layer 158, and poly blocks 144 underneath the remaining portions of photo resist 140. Residual poly spacers 142 should be removed to prevent electrical shorts in the device, and poly blocks 144 form the logic (transistor) gates of the logic devices formed in the peripheral region 130. The resulting structures are shown in FIGS. 14G and 15G.

The remaining photo resist 140 is removed. New photo resist 146 is formed over the structure. A masking step is used to remove the photo resist 146 except for over the peripheral region 130. A poly etch process is then used to remove any polysilicon residue, including residual poly spacers 142, as shown in FIGS. 14H and 15H. Oxide and poly etches are performed to clean oxide on the wordline 69 and disconnect the top and bottom of the wordlines in the termination area at the end of the memory cell pair row (not shown). After photo resist 146 is removed, a nitride etch process is performed to remove nitride layer 158, as illustrated in FIGS. 14I and 15I. A thermal oxidation step follows to form oxide layer 160 on any exposed portions of poly blocks 154/144/156, which encapsulates these poly blocks. The resulting structures are shown in FIGS. 14J and 15J.

The active and strap regions 17/24 are masked with photo resist while ion implantation (e.g. P+) is used to form the third and fourth regions 122/124 in the well region 136, as shown in FIG. 14K. Nitride is then deposited over the structures, followed by an anisotropic nitride etch (such as RIE dry etch) to remove all the deposited nitride except for spacers 162 formed against vertical portions of oxide layer 160, which are adjacent poly blocks 154 (in the active region 17), poly blocks 144 (in the peripheral region 130), and poly blocks 156 (in the strap region 24). The peripheral region 130 is then masked with photo resist while ion implantation (e.g. N+) is then used to form the second regions (i.e. drain regions) 78 in the active region substrate, as shown in FIG. 14K.

A thin anisotropic oxide etch is performed to remove exposed portions of oxide layers 12 and 138 over the substrate 10 in the active and peripheral regions 17/130. This oxide etch also removes the oxide layers 152/58 disposed over poly blocks 154/56/156/72, as well as portions of oxide layer 160 disposed over poly blocks 144. The metal deposition step is then performed, to deposit a metal (e.g. tungsten, cobalt, titanium, nickel, platinum, or molybdenum) over the active, peripheral and strap region structures. The structures are then annealed, permitting the hot metal to flow and to seep into the exposed top portions of the substrate 10 to form the salicide 80 on the substrate next to side wall spacers 162, and into the exposed top portions of poly blocks 154/56 (in active region 17), poly blocks 144 (in peripheral region 130), and poly blocks 156/72 (in strap region 24) to form the layer of polycide 82 thereon. A metal etch process is used to remove the metal deposited on the remaining structure.

The remaining processing steps disclosed above with respect to FIGS. 3S and 4S (including forming BPSG 84, metal contacts 86 and 102, bit line 88, strap jumper 90, metal source line strap 112, metal word line straps 114/116, and metal via 118) are performed to result in the structures shown in FIGS. 14K and 15K. The advantages of this method and the memory cell array formed thereby are that the structure has a simplified (single level) topography such that residual polysilicon used in forming the logic device gate poly's is easier to remove, the control gates 154 have a vertically oriented back wall to more easily form insulation spacers 162, and the logic device gate poly's are formed separately from memory cell control gate poly's so that their respective thicknesses are decoupled and can be optimized separately.

Figure 16:
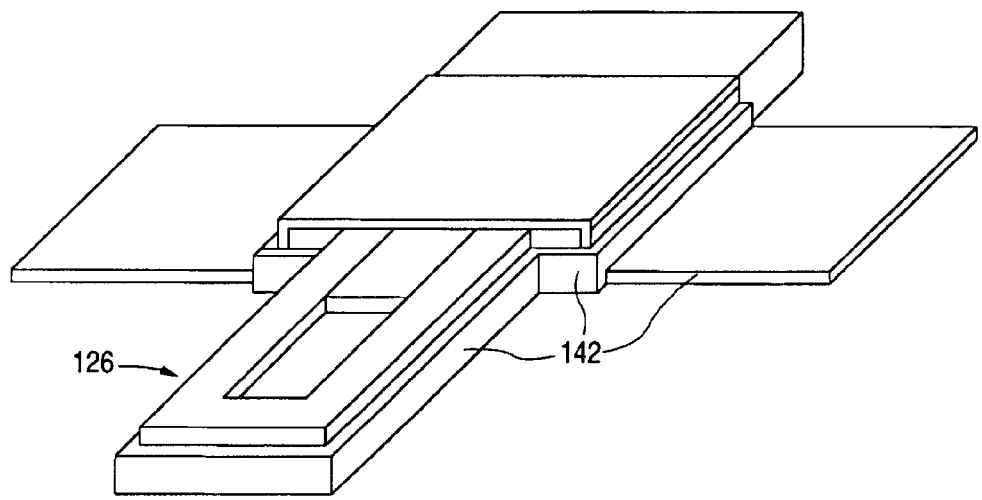
FIG. 16 is a perspective view of the active region structure of FIG. 14G.

FIG. 16 shows the three-dimensional topography of the active region structure of FIG. 14G, including the word line termination area 126 in which the source line 57 extends from the end of the row of memory cell pairs. This process reduces and simplifies the structure topography (i.e. resulting structure only has a single level topography upon which residual poly spacers 142 are formed), which minimizes the amount of residual polysilicon that will need removal. The resulting poly spacers 142 are fewer and smaller. In contrast, the previous embodiment as a more complicated, two level topography (see FIG. 13), which results in a much greater amount of residual polysilicon that is more difficult to remove. Electrical shorts can occur in devices with residual poly stringers that were not adequately removed. The simplified topography and the reduced amount of residual polysilicon in the present embodiment results from two key features of the method process: 1) forming the polysilicon control gates 154 before the formation of the poly gates 144 of the logic devices 148, and 2) forming the polysilicon control gates 154 before the formation of the protective layer of nitride 158 (which allows for the safe removal of the residual polysilicon). The protective layer 158 allows for the use of a thorough anisotropic poly etch for removing the poly stringers without adversely affecting the rest of the memory cell structure.

Second Alternate Embodiment

FIGS. 17A–17H and 18A–18H illustrate a second alternate embodiment for forming the logic devices in the peripheral area 130 and the associated memory cells in the active region 17. This embodiment also reduces and simplifies the structure topography in the active region earlier in the process, which minimizes the formation of unwanted residual polysilicon (i.e. poly stringers) that are formed in later process steps.

Figure 18A:
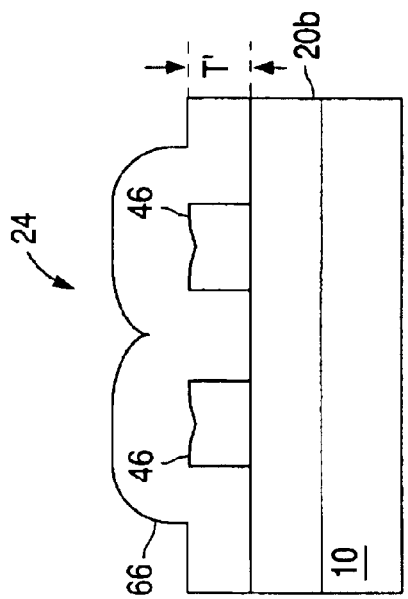
Figure 18B:
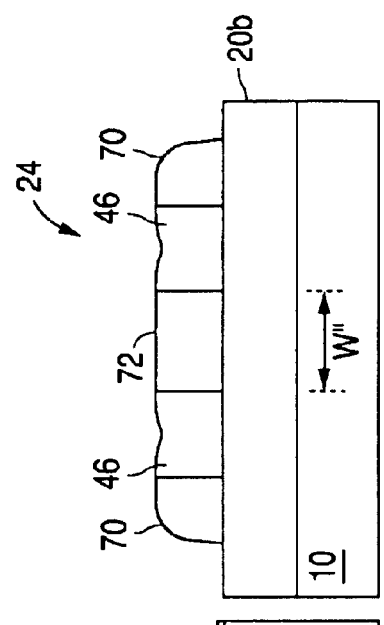
Figure 17A:
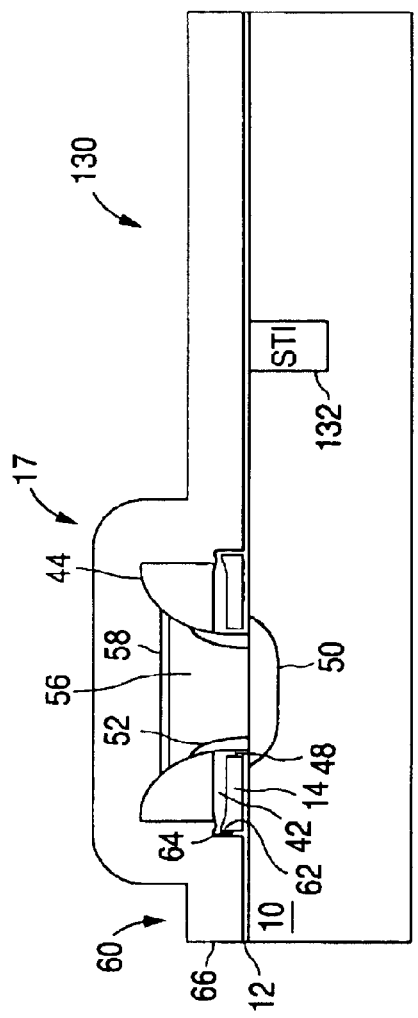
Figure 17B:
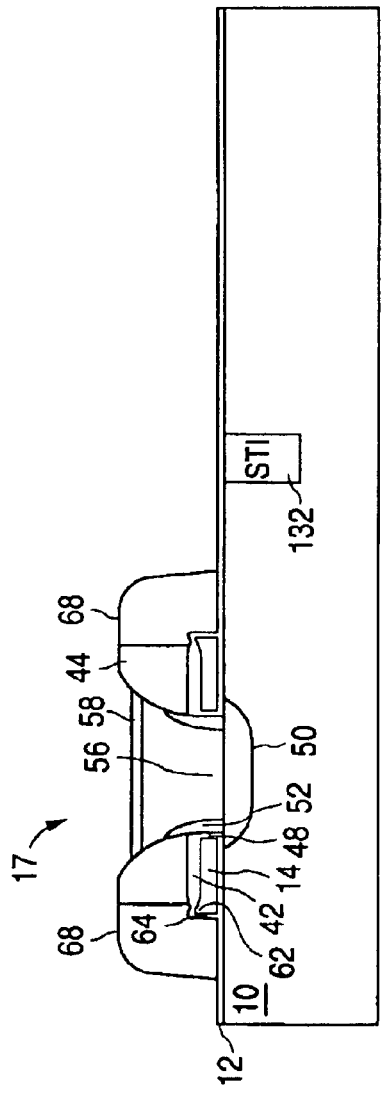

This second alternate embodiment starts with the same structure shown in FIGS. 3L and 4L (reproduced in FIGS. 14A and 15A), as shown in FIGS. 17A and 18A. A poly etch (RIE) is performed to remove poly layer 66 from the active region 17 except for the poly spacers 68 next to oxide spacers 44, as shown in FIG. 17B. In the strap region 24, the poly etch removes poly layer 66 except for the poly spacers 70 next to oxide blocks 46, and the poly block 72 between oxide blocks 46, as shown in FIG. 18B. As with the first embodiment, the width W" between the oxide blocks 46 needs to be small enough (e.g. no greater than approximately twice the thickness T' of the deposited polysilicon) so that poly block 72 fills the space between oxide blocks 46.

Nitride layer 158 is formed over the active, peripheral and strap regions 17/130/24. A masking step is used to protect active and strap regions 17/24 while a nitride etch is used to remove nitride layer 158 from the peripheral region 130 only (as shown in FIGS. 17C and 18C). Once the masking material is removed, the well region 136 is formed in the peripheral region 130 of substrate 10 by masking the structure except for a designated area in the peripheral region 130, and performing suitable ion implantation through oxide layer 12 (i.e. well implant, punch through implant and Vt implant) to form one or more well regions 136 as shown in FIG. 17C. In the preferred embodiment, well region 136 is N type.

An oxide etch is used to remove the exposed portion of oxide layer 12 from the peripheral region 130 (using the substrate 10 as an etch stop). The gate oxide layer 138 is formed on the exposed surface of the substrate 10 using a thermal oxide process, and thus will have a thickness appropriate for the voltage requirements of the logic devices. A layer of polysilicon is next deposited over the structure, following by the photo resist 140 formed over the polysilicon layer. A masking step is then used to remove the photo resist 140 except for locations under which transistor (logic) gates are to be formed in the peripheral region 130. A dry poly etch process is then used to remove the deposited poly layer except for residual poly spacers 142 adjacent vertical portions of nitride layer 158, and poly blocks 144 underneath the remaining portions of photo resist 140, as illustrated in FIGS. 17D and 18D.

The remaining photo resist 140 is removed. New photo resist 146 is formed over the structure. A masking step is used to remove the photo resist 146 except for over the peripheral region 130. A poly etch process is then used to remove any polysilicon residue, including residual poly spacers 142, as shown in FIGS. 17E and 18E. Oxide and poly etches are performed to clean oxide on the wordline 69 and disconnect the top and bottom of the wordlines in the termination area at the end of the memory cell pair row (not shown). After photo resist 146 is removed, a nitride etch process is performed to remove nitride layer 158, as illustrated in FIGS. 17F and 18F. A thermal oxidation step follows to form oxide layer 160 on exposed portions of polysilicon (i.e. poly spacers 68 and 70, and poly blocks 72/144), which encapsulates these poly spacers/blocks. The resulting structures are shown in FIGS. 17G and 18G.

The active and strap regions 17/24 are masked with photo resist while ion implantation (e.g. P+) is used to form the third and fourth regions 122/124 in the well region 136, as shown in FIG. 17H. Nitride is then deposited over the structures, followed by an anisotropic nitride etch (such as RIE dry etch) to remove all the deposited nitride except for spacers 162 formed against oxide layers 160, which are adjacent poly spacers 68 (in the active region 17), poly blocks 144 (in the peripheral region 130), and poly spacers 70 (in the strap region 24). The peripheral region 130 is then masked with photo resist while ion implantation (e.g. N+) is then used to form the second regions (i.e. drain regions) 78 in the active region substrate, as shown in FIG. 17H. The same implant can be optionally used to form the source and drain regions for N-type MOSFETs (not shown) as is well known in the art.

A thin anisotropic oxide etch is performed to remove exposed portions of oxide layers 12 and 138 over the substrate 10 in the active and peripheral regions 17/130. This oxide etch also removes the portions of oxide layer 160 disposed over poly spacers/blocks 68/56/144/70/72. The metal deposition step is then performed, to deposit a metal (e.g. tungsten, cobalt, titanium, nickel, platinum, or molybdenum) over the active, peripheral and strap region structures. The structures are then annealed, permitting the hot metal to flow and to seep into the exposed top portions of the substrate 10 to form the salicide 80 on the substrate next to side wall spacers 162, and into the exposed top portions of poly spacers/blocks 68/56/144/70/72 to form the layer of polycide 82 thereon. A metal etch process is used to remove the metal deposited on the remaining structure.

The remaining processing steps disclosed above with respect to FIGS. 3S and 4S (including forming BPSG 84, metal contacts 86 and 102, bit line 88, strap jumpers 90, metal source line strap 112, metal word line straps 114/116, and metal via 118) are performed to result in the structures shown in FIGS. 17H and 18H.

This process too reduces and simplifies the structure topography, and minimizes the amount of residual polysilicon that will need removal, in the same manner as described above with respect to the first alternate embodiment. Namely, the polysilicon control gates 154 are formed before the formation of the poly gates 144 of the logic devices 148, and before the formation of the protective layer of nitride 158.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells and conductive word/source lines, it should be clear to those having ordinary skill in the art that any appropriate conductive material can be used. Therefore, as used in the claims, the term "conductive material" encompasses all such conductive materials (e.g. polysilicon, polysilicide, salicide, etc). In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or presented in the claims, but rather in any order that allows the proper formation of the memory cell of the present invention. Moreover, the masks shown and described herein are used in a positive masking step processes, where the material under the photo resist exposed to light via the patterned mask aperture 31 is eventually removed. However, negative photo resist processes are known and usable with the present invention, where the material under the photo resist not exposed to light via the patterned mask aperture is eventually removed. With such negative photo resist processes, the masks are reversed, where the opaque mask material replaces the transparent apertures, and vice versa. The word and source lines need not have a continuous width or shape, need not be straight, and need not be formed as spacers, but rather can have any size and shape that effectively connects to each memory cell or memory cell pair in the appropriate memory cell row. Source and drain regions, and/or source and bit lines, can be swapped. Finally, the strap cell method and design of the present invention is applicable to any type or design of memory cell array having lines of polysilicon extending along and connected to rows or columns of memory cells.

What is claimed is:

1. A method of making a memory device, comprising the steps of:
   forming a plurality of memory cells in a memory portion of a semiconductor substrate, wherein the formation of each of the memory cells includes the steps of:

forming a floating gate of conductive material disposed over and insulated from the memory portion of the substrate, and forming a control gate of conductive material disposed over and insulated from the memory portion of the substrate;

forming a layer of protective material over the control gates;

forming a plurality of logic devices in a peripheral region of the semiconductor substrate after the formation of the protective material layer, wherein the formation of each of the logic devices includes the step of forming a block of conductive material disposed over and insulated from the peripheral region of the substrate, and wherein the formation of the blocks of conductive material includes the formation of residual conductive material on the layer of protective material; and removing the residual conductive material without removing the conductive material of the control gates.

2. The method of claim 1, wherein the formation of each of the memory cells further includes forming spaced apart first and second regions in the memory portion of the substrate having a conductivity type different from that of a portion of the substrate adjacent thereto, with a first channel region of the substrate defined therebetween, wherein at least a portion of the floating gate and at least a portion of the control gate are disposed over and insulated from the first channel region of the substrate.

3. The method of claim 2, wherein the formation of each of the logic devices further includes forming spaced apart third and fourth regions in the peripheral region of the substrate having a conductivity type different from that of a portion of the substrate adjacent thereto, with a second channel region of the substrate defined therebetween, wherein the block of conductive material is disposed over and insulated from the second channel region.

4. The method of claim 1, wherein for each of the memory cells, the formation of the control gate further includes forming a first portion of the control gate that is laterally adjacent to and insulated from the floating gate.

5. The method of claim 4, wherein for each of the memory cells, the formation of the control gate further includes forming a second portion of the control gate that is vertically disposed over and insulated from the floating gate.

6. The method of claim 1, wherein the formation of the protective material layer over the control gates includes:
   forming the protective material layer over both the memory and peripheral portions of the substrate, and
   removing a portion of the protective material layer formed over the peripheral portion of the substrate.

7. The method of claim 1, wherein for each of the memory cells, the protective material layer includes a vertical portion that extends up and over the control gate.

8. The method of claim 7, wherein for each of the memory cells, the residual conductive material is formed laterally adjacent to the vertical portion of the protective material layer.

9. The method of claim 8, wherein for each of the memory cells, the residual conductive material is formed as a spacer of the conductive material.

10. The method of claim 1, wherein for each of the memory cells, the control gate is formed as a spacer of the conductive material.

* * * * *